(12) United States Patent
Qiu et al.

(10) Patent No.: US 11,764,316 B2
(45) Date of Patent: *Sep. 19, 2023

(54) BACK CONTACT STRUCTURE AND SELECTIVE CONTACT REGION BURIED SOLAR CELL COMPRISING THE SAME

(71) Applicant: Solarlab Aiko Europe GmbH, Freiburg (DE)

(72) Inventors: Kaifu Qiu, Yiwu (CN); Yongqian Wang, Yiwu (CN); Xinqiang Yang, Yiwu (CN); Gang Chen, Yiwu (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/540,272

(22) Filed: Dec. 2, 2021

(65) Prior Publication Data

US 2022/0393043 A1    Dec. 8, 2022

Related U.S. Application Data

(63) Continuation of application No. 17/383,468, filed on Jul. 23, 2021, now abandoned.

(30) Foreign Application Priority Data

Jun. 4, 2021    (CN) .......................... 202110626889.4

(51) Int. Cl.
  *H01L 31/0224*    (2006.01)
  *H01L 31/0236*    (2006.01)
  *H01L 31/028*    (2006.01)

(52) U.S. Cl.
  CPC .... *H01L 31/022441* (2013.01); *H01L 31/028* (2013.01); *H01L 31/02363* (2013.01)

(58) Field of Classification Search
  CPC ......... H01L 31/022441; H01L 31/0516; H01L 31/02363; H01L 31/028; H01L 31/068;
  (Continued)

(56) References Cited

U.S. PATENT DOCUMENTS

2014/0096821 A1    4/2014    Chen et al.
2014/0360571 A1*  12/2014    Ji ........................ H01L 31/0745
                                                                  136/258
(Continued)

FOREIGN PATENT DOCUMENTS

KR    20130037395 A      4/2013
WO    WO-2013125036 A1 *  8/2013    ..... H01L 31/022441

OTHER PUBLICATIONS

English machine translation of WO2013/125036A1. (Year: 2013).*

*Primary Examiner* — Michael Y Sun
(74) *Attorney, Agent, or Firm* — MATTHIAS SCHOLL P.C.; Matthias Scholl

(57) ABSTRACT

A back contact structure includes: a silicon substrate including a back surface including a plurality of recesses disposed at intervals; a plurality of first conductive regions and a plurality of second conductive regions disposed alternately on the back surface of the silicon substrate; a second dielectric layer disposed between the plurality of first conductive regions and the plurality of second conductive regions; and a conductive layer disposed on the plurality of first conductive regions and the plurality of second conductive regions. One of the plurality of first conductive regions and the plurality of second conductive regions is disposed inside the plurality of recesses, respectively, and the other one is disposed outside the plurality of recesses; each first conductive region includes a first dielectric layer and a first doped region which are disposed successively, and each second conductive region includes a second doped region.

28 Claims, 14 Drawing Sheets

(58) Field of Classification Search
CPC ........... H01L 31/0747; H01L 31/02167; H01L 31/02168; H01L 31/035272; H01L 31/056; H01L 31/0682; H01L 31/1804; H01L 31/1868; H01L 31/035281; Y02E 10/52; Y02E 10/547
See application file for complete search history.

(56) References Cited

U.S. PATENT DOCUMENTS

2016/0284896 A1* 9/2016 Westerberg ......... H01L 31/0288
2017/0117433 A1 4/2017 Stangl et al.

* cited by examiner

BACK CONTACT STRUCTURE AND SELECTIVE CONTACT REGION BURIED SOLAR CELL COMPRISING THE SAME

CROSS-REFERENCE TO RELATED APPLICATIONS

This application is a continuation of U.S. application Ser. No. 17/383,468, filed Jul. 23, 2021, and further claims foreign priority benefits to Chinese Patent Application No. 202110626889.4, filed Jun. 4, 2021. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, MA 02142.

BACKGROUND

The disclosure relates to the field of solar cells, and more particularly to a back contact structure and a selective contact region buried solar cell comprising the same.

In a crystalline silicon solar cell, efficiency losses of the cell may be divided into two aspects, i.e., electric losses and optical losses. Important parts of the electric losses are composite losses and resistance losses caused by metal-semiconductor contacts, while an important part of the optical losses is a shading of metal grid lines of illuminated faces.

A passivated metal contact structure has remarkable electrical performance, and can obtain a low contact resistivity and low surface composition at the same time; this structure comprises an ultrathin tunneling oxide layer and an N-type doped or P-type doped polycrystalline silicon layer. Since the absorption of light by the doped polycrystalline silicon layer belongs to "parasitic" absorption, i.e., no contribution to a photo-generated current, the passivated metal contact structure is chiefly applied to a back surface of the cell, so that a front surface thoroughly avoids the shading of the metal grid lines. Solar radiation received on the solar cell generates electrons and holes; these electrons and holes are migrated to the doped polycrystalline silicon layer, to generate a voltage difference in the doped polycrystalline silicon layer. Currently, it is available to configure that a solar cell is composed of the foregoing passivated metal contact structure and another passivated metal contact structure, or a solar cell is composed of the foregoing passivated metal contact structure and a diffusion structure.

The existing passivated contact structure and the diffusion structure are directly deposited on a back of a silicon slice; however, when they are connected to each other without separation, undesirable phenomena such as electric leakage would occur. Hence, to solve the problem of no separation above, by forming an ultra-condensed trench between the passivated contact structure and the diffusion structure, the passivated contact structure is separated from the diffusion structure, to prevent a cell open-circuit voltage reduction from electric leakage. However, the existing trench is prepared through laser perforation or wet etching; in this case, since the width of the existing trench is dozens of microns, and thus width control is highly required, so that the preparation is difficult. Besides, the passivation is performed using only a single dielectric layer; however, using the single dielectric layer for passivation has a relatively poor passivation effect and a poor inner back reflection effect.

SUMMARY

An objective of an embodiment of the disclosure is to provide a back contact structure of a solar cell, aiming at solving the existing problems of a high trench width control requirement and a poor passivation effect.

The disclosure provides a back contact structure of a solar cell, comprising
- a silicon substrate, the silicon substrate comprising a back surface comprising a plurality of recesses disposed at intervals;
- a plurality of first conductive regions and a plurality of second conductive regions disposed alternately on the back surface of the silicon substrate, wherein one of the plurality of first conductive regions and the plurality of second conductive regions is disposed inside the plurality of recesses, respectively, and the other one is disposed outside the plurality of recesses; each first conductive region comprises a first dielectric layer and a first doped region which are disposed successively, and each second conductive region comprises a second doped region;
- a second dielectric layer disposed between the plurality of first conductive regions and the plurality of second conductive regions, wherein the second dielectric layer is at least one in number; and
- a conductive layer disposed on the plurality of first conductive regions and the plurality of second conductive regions.

In a class of this embodiment, the first doped region is a P-type doped region, and the second doped region is an N-type doped layer; or the first doped region is an N-type doped region, and the second doped region is a P-type doped layer.

In a class of this embodiment, the first doped region comprises doped polycrystalline silicon, doped silicon carbide or doped amorphous silicon.

In a class of this embodiment, the first dielectric layer is one of a tunneling oxide layer, an intrinsic silicon carbide layer and an intrinsic amorphous silicon layer, or a combination thereof.

In a class of this embodiment, the second dielectric layer is one of an aluminum oxide layer, a silicon nitride layer, a silicon oxynitride layer, an intrinsic silicon carbide layer, an intrinsic amorphous silicon layer and a silicon oxide layer, or a combination thereof.

In a class of this embodiment, the second dielectric layer covers regions between the first conductive regions and the second conductive regions, or extends to cover the first conductive regions and/or the second conductive regions.

In a class of this embodiment, the part of the back surface of the silicon substrate between the first conductive regions and the second conductive regions comprises a rough texture structure.

In a class of this embodiment, the width of the P-type doped region is 300-600 μm, or, the width of the N-type doped region is 100-500 μm.

In a class of this embodiment, the depth of each recess is 0.01-10 μm, and the horizontal distance between the first conductive regions and the second conductive regions is 0-500 μm.

In a class of this embodiment, the first dielectric layer covers the first doped regions, or extends to cover regions between the first doped regions and the second doped regions.

In a class of this embodiment, the recess is an arc, a trapezoid, or a square.

In a class of this embodiment, the second doped region has a junction depth of 0.01-1 µm, a sheet resistance of 10-500 ohm/sqr, and a surface concentration of 1E18-1E21 $cm^{-3}$.

In a class of this embodiment, the thickness of the first dielectric layer is 1-20 nm, and the total thickness of the plurality of first conductive regions is greater than 20 nm.

In a class of this embodiment, the doped silicon carbide comprises doped hydrogenated silicon carbide.

In a class of this embodiment, the first dielectric layer comprises the tunneling oxide layer and the intrinsic silicon carbide layer.

In a class of this embodiment, the tunneling oxide layer comprises one or more of a silicon oxide layer and an aluminum oxide layer.

In a class of this embodiment, the intrinsic silicon carbide layer in the first dielectric layer comprises an intrinsic hydrogenated silicon carbide layer.

In a class of this embodiment, the second dielectric layer comprises the aluminum oxide layer and the intrinsic silicon carbide layer or the silicon oxide layer and the intrinsic silicon carbide layer, and the thickness of the second dielectric layer is greater than 25 nm.

In a class of this embodiment, the thickness of the aluminum oxide layer or the silicon oxide layer in the second dielectric layer is less than 25 nm, and the thickness of the intrinsic silicon carbide layer in the second dielectric layer is greater than 10 nm.

In a class of this embodiment, the intrinsic silicon carbide layer in the second dielectric layer comprises at least one first intrinsic silicon carbide film.

In a class of this embodiment, the refractive indexes of the first intrinsic silicon carbide films decrease from the back surface of the silicon substrate to outside.

In a class of this embodiment, a magnesium fluoride layer is disposed at an outer layer of the second dielectric layer.

In a class of this embodiment, the conductive layer is a TCO transparent conductive film and/or a metal electrode.

In a class of this embodiment, the metal electrode comprises a silver electrode, a copper electrode, an aluminum electrode, a tin-clad copper electrode, or a silver-clad copper electrode.

In a class of this embodiment, the copper electrode is electro-plated copper prepared through an electroplating process or a copper electrode prepared through physical vapor deposition.

The objective of another embodiment of the disclosure is to further provide a selective contact region buried solar cell, comprising:

the foresaid back contact structure; and a third dielectric layer disposed on a front surface of the silicon substrate.

In a class of this embodiment, the third dielectric layer is one of an aluminum oxide layer, a silicon nitride layer, a silicon oxynitride layer, a silicon carbide layer, an intrinsic amorphous silicon layer and a silicon oxide layer, or a combination thereof.

In a class of this embodiment, the third dielectric layer comprises the silicon oxide layer and the silicon carbide layer or the aluminum oxide layer and the silicon carbide layer, and the thickness of the third dielectric layer is greater than 50 nm.

In a class of this embodiment, the thickness of the aluminum oxide layer or the silicon oxide layer in the third dielectric layer is less than 40 nm, and the thickness of the silicon carbide layer in the third dielectric layer is greater than 10 nm.

In a class of this embodiment, the silicon carbide layer in the third dielectric layer comprises at least one silicon carbide.

In a class of this embodiment, the refractive indexes of different silicon carbide films decrease from the front surface of the silicon substrate to outside.

In a class of this embodiment, a magnesium fluoride layer is disposed at an outer layer of the third dielectric layer.

In a class of this embodiment, an electric field layer or a floating junction is further disposed between the front surface of the silicon substrate and the third dielectric layer.

The objective of another embodiment of the disclosure is to further provide a cell assembly comprising the selective contact region buried solar cell as stated above.

The objective of another embodiment of the disclosure is to further provide a photovoltaic system, comprising the cell assembly as stated above.

The objective of another embodiment of the disclosure is to further provide a selective contact region buried solar cell manufacturing method, the method comprising:

forming a plurality of recesses disposed at intervals on a back surface of a silicon substrate;

alternately preparing first conductive regions and second conductive regions on the silicon substrate, where one of the first conductive region and the second conductive region is disposed inside the recess and the other one is disposed outside the recess, each first conductive region comprises a first dielectric layer and a first doped region which are disposed successively, and each second conductive region comprises a second doped region;

respectively preparing a second dielectric layer and a third dielectric layer on the back and front surface of the silicon substrate; and preparing a conductive layer on the first conductive regions and the second conductive regions.

In a class of this embodiment, the step of alternately preparing first conductive regions and second conductive regions on the silicon substrate comprises:

successively preparing the first dielectric layer and the first doped region having a first conductivity type inside or outside a recess; and preparing the second doped region having a second conductivity type outside or inside the corresponding recess, where the first conductivity type is opposite to the second conductivity type.

In a class of this embodiment, the step of successively preparing the first dielectric layer and the first doped region having a first conductivity type inside or outside a recess comprises:

preparing the first dielectric layer inside or outside the recess;

depositing intrinsic amorphous silicon or intrinsic silicon carbide on the first dielectric layer;

performing the first conductivity type of doping on the intrinsic amorphous silicon or the intrinsic silicon carbide; and performing high-temperature (peak temperature around 850° C.) crystallization treatment, so that the intrinsic amorphous silicon or the intrinsic silicon carbide is changed into doped polycrystalline silicon or doped silicon carbide to obtain the first doped region having the first conductivity type.

In a class of this embodiment, the step of successively preparing the first dielectric layer and the first doped region having a first conductivity type inside or outside a recess comprises:

preparing the first dielectric layer inside or outside the recess;

depositing intrinsic amorphous silicon or intrinsic silicon carbide on the first dielectric layer; and performing the first conductivity type of diffusion on the intrinsic amorphous silicon or the intrinsic silicon carbide, so that the intrinsic amorphous silicon or the intrinsic silicon carbide is changed into doped polycrystalline silicon or doped silicon carbide to obtain the first doped region having the first conductivity type.

In a class of this embodiment, the step of successively preparing the first dielectric layer and the first doped region having a first conductivity type inside or outside a recess comprises:

preparing the first dielectric layer inside or outside the recess;

depositing the first conductivity type of doped amorphous silicon or doped amorphous silicon carbide on the first dielectric layer; and performing high-temperature crystallization treatment, so that the doped amorphous silicon or the doped amorphous silicon carbide is changed into doped polycrystalline silicon or doped silicon carbide to obtain the first doped region having the first conductivity type.

In a class of this embodiment, the step of preparing the second doped region having a second conductivity type outside or inside the corresponding recess comprises:

introducing a source gas corresponding to the second conductivity type for thermal diffusion outside or inside the corresponding recess to form the second doped region having the second conductivity type; or depositing or spin-coating a doping source corresponding to the second conductivity type for thermal diffusion outside or inside the corresponding recess to form the second doped region having the second conductivity type; or injecting ions corresponding to the second conductivity type for thermal diffusion outside or inside the corresponding recess to form the second doped region having the second conductivity type.

In a class of this embodiment, the step of performing the first conductivity type of doping on the intrinsic amorphous silicon or the intrinsic silicon carbide comprises:

injecting the first conductivity type of ions onto the intrinsic amorphous silicon or the intrinsic silicon carbide for doping; or depositing the first conductivity type of doping sources on the intrinsic amorphous silicon or the intrinsic silicon carbide for doping; or introducing the first conductivity type of source gas onto the intrinsic amorphous silicon or the intrinsic silicon carbide for doping.

In the back contact structure provided in the embodiment of the disclosure, recesses are disposed at intervals on a back surface of a silicon substrate, and first conductive regions are disposed inside or outside the recesses and the second conductive regions are disposed outside or inside the recesses in an alternate manner, so that separation between the first conductive regions and the second conductive regions is implemented through some recesses or some protrusions outside the recesses; moreover, the recesses disposed have a higher tolerance in width control than existing trenches, so the preparation of the recesses is easier than preparation of the existing trenches. In addition, since the arrangement of the recesses enables the first dielectric layer to be in contact with both bottom walls and sidewalls of the recesses when the first conductive regions are disposed inside the recesses, the carriers generated on the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer induced passivation is achieved on the back surface of the silicon substrate through the second dielectric layer having at least one layer, and then a better passivation effect is yielded and inner back reflection is enhanced, thereby solving the existing problems of a high trench width control requirement and a poor passivation effect and a poor inner back reflection.

DESCRIPTION OF EMBODIMENTS

Figure 1:
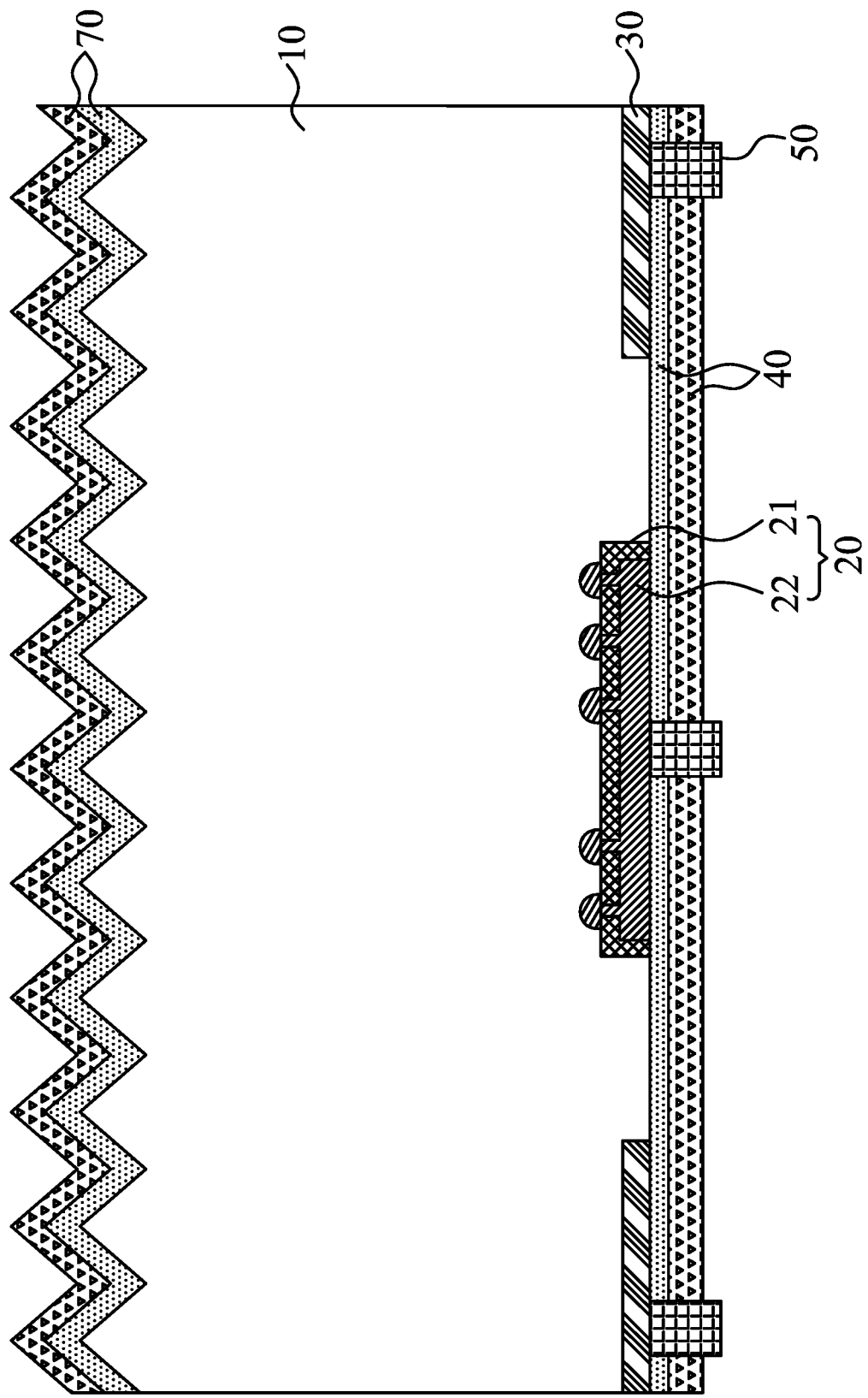
FIG. 1 to FIG. 13 are structural schematic diagrams of various implementations of a selective contact region buried solar cell of one embodiment of the disclosure.

To make the objective, technical solutions, and advantages of the disclosure clearer, the following further describes the disclosure in detail in conjunction with the accompanying drawings and embodiments. The specific embodiments described herein are merely used for explaining the disclosure but are not intended to limit the disclosure.

In the disclosure, unless otherwise specified and defined, the terms such as "mount", "connected with", "connected to" and "fix" should be comprehended in a broad sense. For example, these terms may be comprehended as being fixedly connected, detachably connected or integrally connected; or mechanically connected, or electrically connected; or directly connected, or indirectly connected through an intermediate medium, or in an internal communication between two elements. The specific meanings about the foregoing terms in the disclosure may be understood by those skilled in the art according to specific circumstances. The term "and/or" used in the text comprises any or all combinations of one or more related listed items.

In the disclosure, recesses are disposed at intervals on a back surface of a silicon substrate, and first conductive regions are disposed inside or outside the recesses and the second conductive regions are disposed outside or inside the recesses in an alternate manner, so that separation between the first conductive regions and the second conductive regions is implemented through some recesses or some protrusions outside the recesses; moreover, the recesses disposed have a lower width control requirement than existing trenches, and preparation of the recesses is easier than preparation of the existing trenches. In addition, since the arrangement of the recesses enables the first dielectric layer to be in contact with both bottom walls and sidewalls of the recesses when the first conductive regions are disposed inside the recesses, current carriers generated on the silicon substrate would also be easily separated through the first dielectric layer on the sidewalls of the recesses and selectively collected into the corresponding first doped regions, so that leakage current can be reduced and selective transport of the current carriers in longitudinal and transverse directions can also be implemented, thereby facilitating multi-dimensional collection of the current carriers on the bottom walls and sidewalls of the recesses. Since a second dielectric layer disposed is at least one in number, multi-layer passivation is achieved on the back surface of the silicon substrate through the second dielectric layer having at least one layer, and then a better passivation effect is yielded and inner back reflection is enhanced, thereby yielding a better passivation effect and a better inner back reflection effect and solving the existing problems of a high trench width control requirement and a poor passivation effect.

Embodiment 1

The first embodiment of the disclosure provides a back contact structure of a solar cell. To facilitate explanation, merely the parts related to the embodiment of the disclosure are illustrated. With reference to FIG. 1 to FIG. 13, the back contact structure of the solar cell provided by the embodiment of the disclosure comprises:

recesses disposed at intervals on a back surface of a silicon substrate 10;

first conductive regions 20 and second conductive regions 30 disposed alternately, where one of the first conductive region and the second conductive region is disposed inside the recess and the other one is disposed outside the recess, each first conductive region 20 comprises a first dielectric layer 21 and a first doped region 22 which are disposed in sequence, and each second conductive region 30 comprises a second doped region;

a second dielectric layer 40 disposed between the first conductive regions 20 and the second conductive regions 30, where the second dielectric layer 40 is at least one in number and the refractive indexes decrease from the back surface of the silicon substrate 10 to outside; and a conductive layer 50 disposed on the first conductive regions 20 and the second conductive regions 30.

In one embodiment of the disclosure, the silicon substrate 10 has a front facing the sun and a back opposite to the front during a normal working period, and the front is an illuminated face; the back is disposed on the other side of the silicon substrate 10 with respect to the front, i.e., the front and the back are located on different sides, i.e., opposite sides, of the silicon substrate 10, where in this embodiment, the silicon substrate 10 is an N-type silicon slice, and it can be understood that, in other embodiments, the silicon substrate 10 may also be another silicon slice. The recesses are formed at intervals on the back surface of the silicon substrate 10; the recesses can be formed through laser ablation or through a combination of a mask (such as a hard mask, a silicon oxide mask, a silicon nitride mask, and a photoresist mask) and wet/dry etching; in this case, due to the recesses formed at intervals on the back surface of the silicon substrate 10, a region between two adjacent recesses located on the silicon substrate 10 is roughly in a protrusion shape, and thus a back pattern of the silicon substrate 10 generally appears to be formed by staggering the recesses and protrusions.

Figure 2:
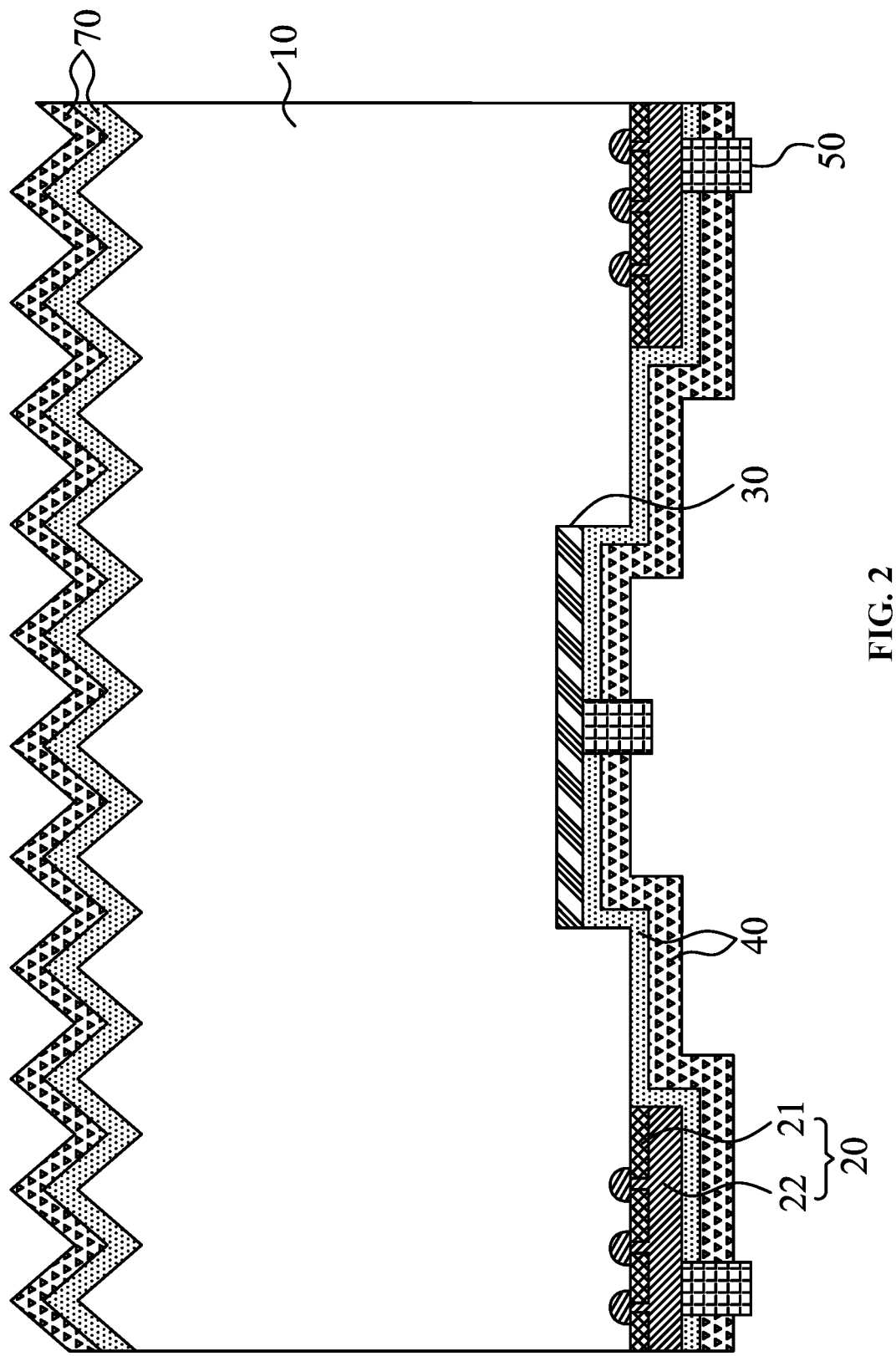

Furthermore, in one embodiment of the disclosure, as shown in FIG. 1, it is available that the first conductive regions 20 are disposed inside the recesses, and then the second conductive regions 30 are disposed outside the recesses; or as shown in FIG. 2, the first conductive regions 20 are disposed outside the recesses, and then the second conductive regions 30 are disposed inside the recesses. Furthermore, the first doped region 22 and the second doped region have opposite conductivity types, where if the first doped region 22 is a P-type doped region, the second doped region is an N-type doped layer; or if the first doped region 22 is an N-type doped region, the second doped region is a P-type doped layer.

Figure 3:
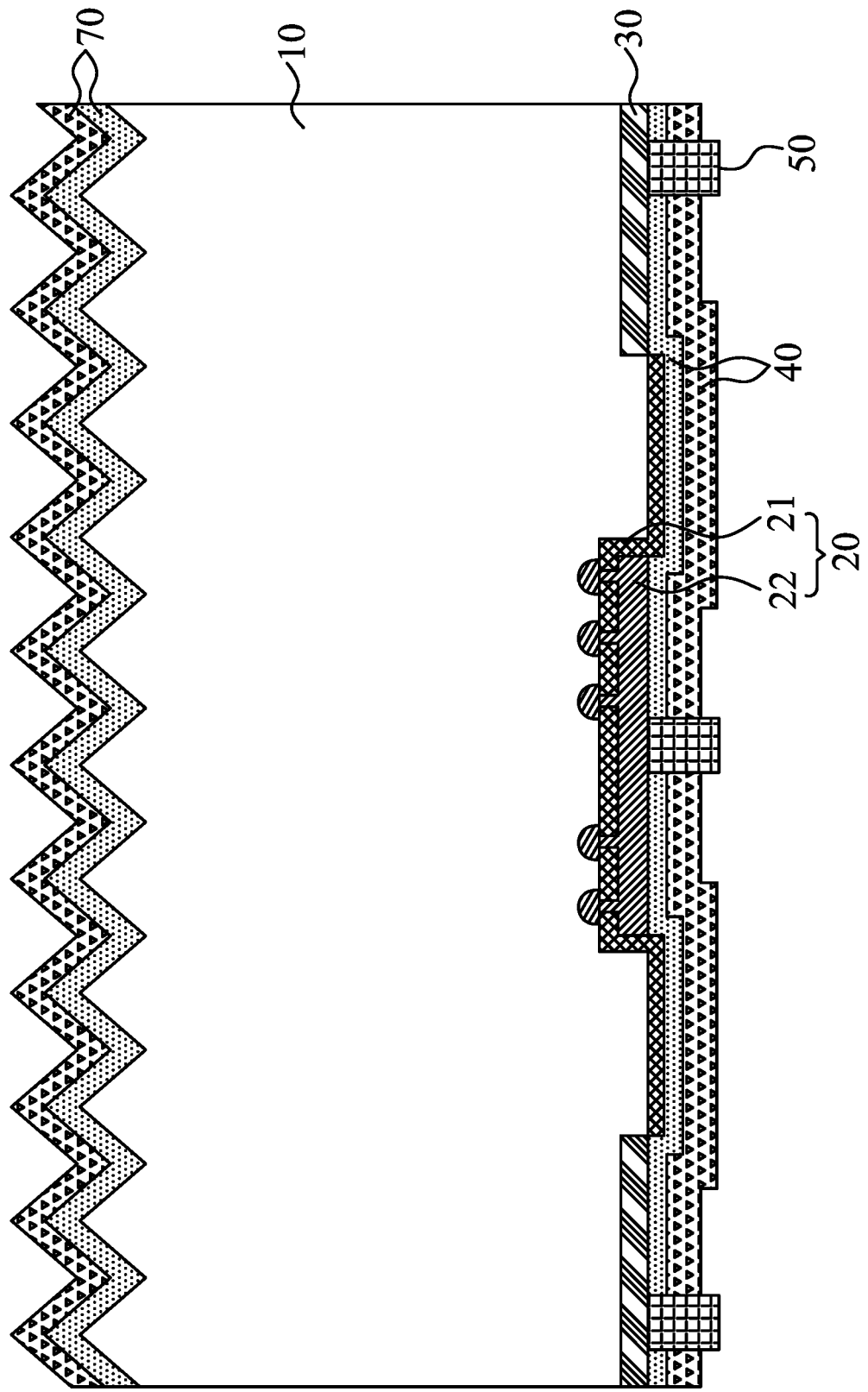
Figure 4:
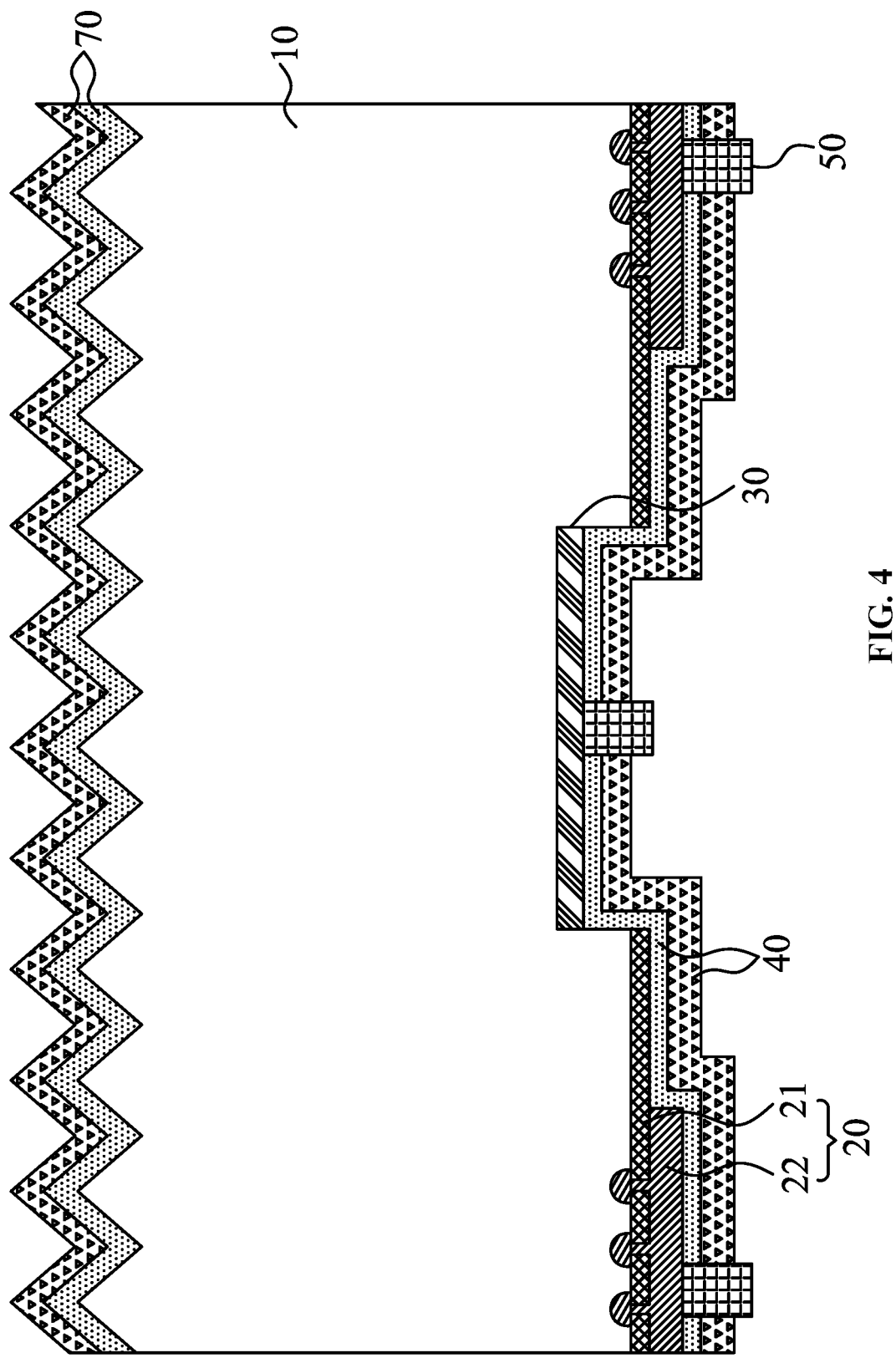

Furthermore, in one embodiment of the disclosure, the first dielectric layer 21 covers the first doped regions 22, or extends to cover regions between the first doped regions 22 and the second doped regions. When the first conductive regions 20 are disposed inside the recesses, if the first dielectric layer 21 merely covers the first doped regions 22, as shown in FIG. 1, the first dielectric layer 21 is connected to bottom walls and sidewalls of the recesses, and if the first dielectric layer 21 further extends to cover the regions between the first doped regions 22 and the second doped regions, the connection state is shown in FIG. 3. Moreover, when the first conductive regions 20 are disposed outside the recesses, if the first dielectric layer 21 merely covers the first doped regions 22, the connection state is shown in FIG. 2, and if the first dielectric layer 21 further extends to cover the regions between the first doped regions 22 and the second doped regions, the connection state is shown in FIG. 4.

The first dielectric layer 21 is located between the silicon substrate 10 and the first doped regions 22, and is used as a tunneling structure; moreover, the first dielectric layer 21 and the first doped regions 22 connected thereto and covered thereby together form a passivated contact structure. The passivated contact structure provides good surface passivation for the back surface of the silicon substrate 10; in addition, generally speaking, the first dielectric layer 21 has a thin enough thickness, in which one type of current carriers achieves selective transmission through a tunneling principle, while another type of current carriers is hard to tunnel through the first dielectric layer 21 due to the existence of a barrier and a doped region field effect. Therefore, the first dielectric layer 21 may allow one type of current carriers to tunnel through and enter the first doped regions 22 while blocking another type of current carriers from passing through to cause composition, so that interface composition can be obviously reduced, the solar cell has relatively high open-circuit voltage and short-circuit current, and then photovoltaic conversion efficiency is improved. In addition, as shown in FIG. 1 to FIG. 13, a plurality of inner diffusion regions corresponding to the first doped regions 22 are formed on the surface of the silicon substrate 10 in contact with the first dielectric layer 21. In a preferable embodiment of the disclosure, it is preferable that the first conductive regions 20 are disposed inside the recesses; and in this case, the first dielectric layer 21 may be in contact with both bottom walls and sidewalls of the recesses, so that current carriers generated on the silicon substrate 10 would also be easily separated through the first dielectric layer 21 on the sidewalls of the recesses and selectively collected into the corresponding first doped regions 22, thereby facilitating multi-dimensional collection of the current carriers on the bottom walls and sidewalls of the recesses.

Furthermore, in one embodiment of the disclosure, the first dielectric layer 21 is preferably one of a tunneling oxide layer, an intrinsic silicon carbide layer and an intrinsic amorphous silicon layer, or a combination thereof. As some examples of the disclosure, for example, the first dielectric layer 21 may be a tunneling oxide layer of a single material, may also be a combination of a tunneling oxide layer and the intrinsic amorphous silicon layer of multiple materials, and may further be a combination of multiple layers of intrinsic amorphous silicon having different refractive indexes of a single material. It can be understood that the specific structural arrangement of the first dielectric layer 21 comprises, but not limited to, the several modes listed above, and according to actual usage needs, the first dielectric layer 21 is correspondingly configured, which is not specifically limited herein.

In a preferable embodiment of the disclosure, specifically, the first dielectric layer 21 is preferably the tunneling oxide layer and the intrinsic silicon carbide layer; in this case, the tunneling oxide layer and the intrinsic silicon carbide layer are successively arranged outward from the silicon substrate 10, the tunneling oxide layer is in contact with the back surface of the silicon substrate 10, and the intrinsic silicon carbide layer is in contact with the first doped regions 22. Furthermore, the tunneling oxide layer preferably comprises one or more of a silicon oxide layer and an aluminum oxide layer. Hence, the first dielectric layer 21 may also be a combination of the silicon oxide layer and the aluminum oxide layer in the tunneling oxide layer. The intrinsic silicon carbide layer in the first dielectric layer 21 comprises an intrinsic hydrogenated silicon carbide layer. In this case, the tunneling oxide layer and the intrinsic silicon carbide layer reduce the density of interface states between the silicon substrate 10 and the first doped regions 22 as well as the second doped regions through chemical passivation. For example, hydrogen in the intrinsic hydrogenated silicon carbide layer enters the silicon substrate 10 under the function of a diffusion mechanism and a thermal effect, to neutralize dangling bonds of the back surface of the silicon substrate 10, to passivate defects of the back surface of the silicon substrate 10, and to transfer an energy band in a forbidden band to a valence band or a conduction band to improve probability for the current carriers to enter the first doped regions 22 through the first dielectric layer 21.

Generally speaking, in certain embodiments, during specific usage, the first dielectric layer 21 preferably adopts the silicon oxide layer of 1-2 nm and the intrinsic silicon carbide layer of 2-5 nm; as compared with only using the silicon oxide layer as the tunneling structure, the intrinsic silicon carbide layer may further provide an additional hydrogen passivation effect; a preparing process window of the tunneling structure is enlarged, without influencing the tunneling effect; certainly, the silicon oxide layer of 1-2 nm, or the silicon oxide layer of 1 nm and the aluminum oxide layer of 1 nm, or two or more of the intrinsic silicon carbide layers having different refractive indexes can also be directly adopted; as can be understood, the specific structure arrangement of the first dielectric layer 21 comprises, but not limited to, the several specific examples listed above. In addition, the first dielectric layer 21 may also be an intrinsic microcrystalline silicon layer, an intrinsic microcrystalline silicon oxide layer, an intrinsic amorphous silicon oxide layer, etc. As shown in FIG. 1 to FIG. 13, it is only shown that the first dielectric layer 21 is a one-layer structure; as can be understood, the specific structure of the first dielectric layer 21 is set according to actual needs and does not completely follow the accompanying drawings of the description.

Furthermore, in one embodiment of the disclosure, the first doped region 22 preferably comprises doped polycrystalline silicon or doped silicon carbide or doped amorphous silicon, where the doped silicon carbide may comprise doped hydrogenated silicon carbide, and the doped hydrogenated silicon carbide is specifically formed by adding hydrogen when depositing the silicon carbide. When the first dielectric layer 21 comprises the silicon oxide layer and the intrinsic silicon carbide layer, the first doped region 22 is specifically doped silicon carbide. Moreover, when the first dielectric layer 21 comprises the silicon oxide layer or other combinations, the first doped region 22 may be doped polycrystalline silicon or the like. When the first dielectric layer 21 is the intrinsic amorphous silicon layer, the first doped region 22 is specifically doped amorphous silicon.

Furthermore, in one embodiment of the disclosure, the first conductive region 20 comprising the first dielectric layer 21 and the first doped region 22 is disposed inside or outside the recess through deposition or the like. In this case, the thickness of the first dielectric layer 21 is 1-20 nm, and the thickness of the first conductive layer 20 is greater than 20 nm, i.e., the total thickness of the first dielectric layer 21 and the first doped region 22 is greater than 20 nm.

Furthermore, in one embodiment of the disclosure, the second conductive region 30 comprises the second doped region, and the second doped region is a doped layer. The doped layer is different from the first conductive region 20 which is grown inside the recess through deposition or the like, and the doped layer is a diffusion structure formed by doping different types of diffusion sources on the silicon substrate 10. Therefore, the doped layer is not grown. Instead, the silicon substrate 10 is partially diffused to form the doped layer. The second doped region has a junction depth of 0.01-1 μm, a sheet resistance of 10-500 ohm/sqr, and a surface concentration of 1E18-1E21 $cm^{-3}$. In addition, the second doped region may be a P-type doped layer or an N-type doped layer. The specific conductivity type of the first doped region 22 is set to be opposite to that of the second doped region. The P-type doped layer is formed by diffusion doped with boron, aluminum, gallium or the like, and the N-type doped layer is formed by diffusion doped with nitrogen, phosphorus, arsenic or the like. In this case, the N-type doped layer is an N+ layer with respect to the silicon substrate 10 which is specifically an N-type silicon slice, i.e., the doped layer is formed by partial heavy doping.

Furthermore, in one embodiment of the disclosure, the distance between the first conductive regions 20 and the second conductive regions 30 is 0-500 μm, i.e., the first conductive regions 20 and the second conductive regions 30 may be adjacent to each other or spaced part from each other in a horizontal direction. That is to say, the first conductive regions 20 or the second conductive regions 30 disposed on the protrusions outside the recesses may be disposed on some or all regions of the protrusions.

Figure 5:
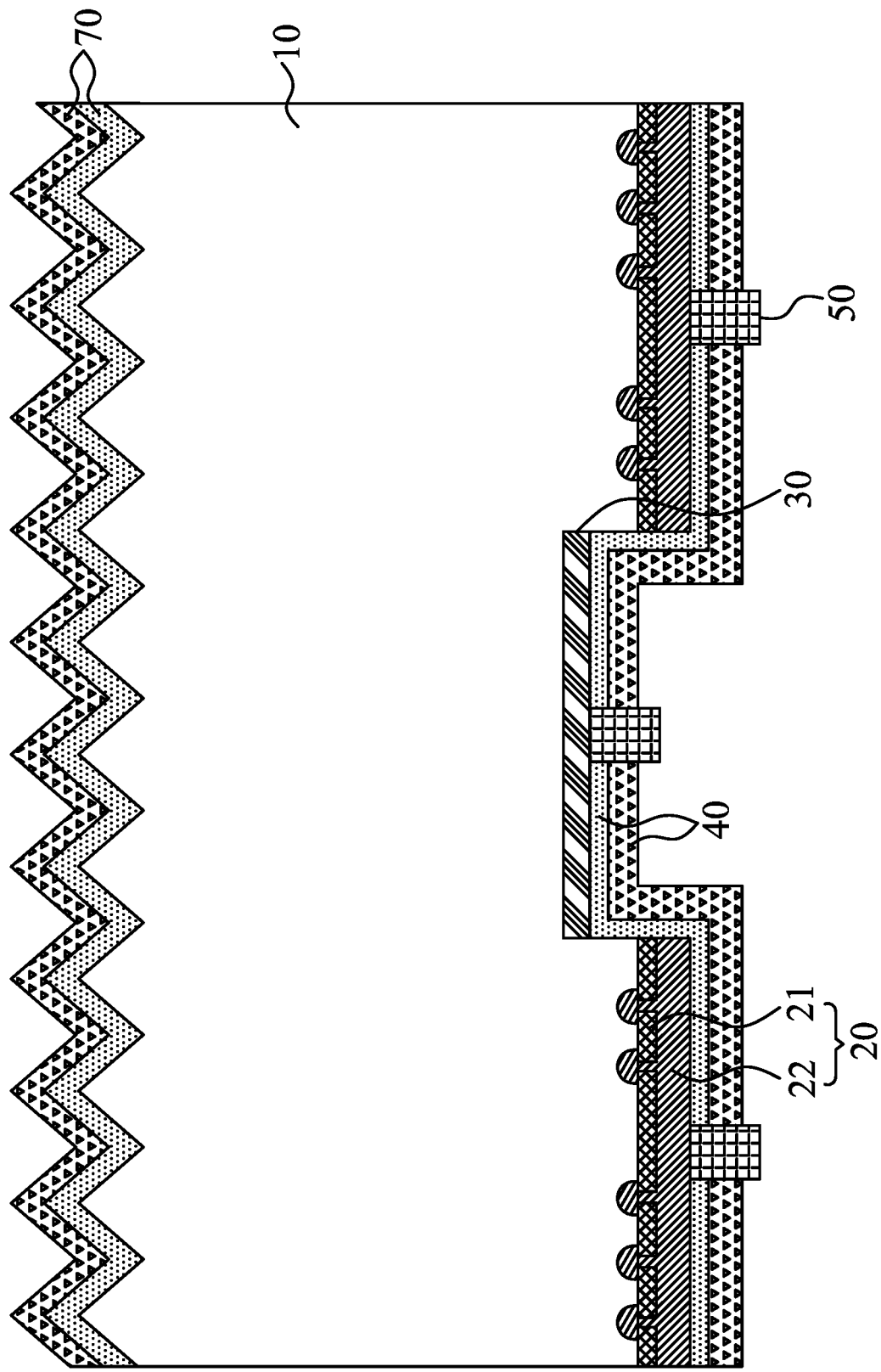

When the first conductive regions 20 are disposed on the protrusions outside the recesses and the second conductive regions 30 are disposed inside the recesses, since the first conductive regions 20 are grown on the protrusions through deposition and the second conductive regions 30 disposed inside the recesses are formed by doping on the silicon substrate 10 on the bottoms of the recesses, the height difference between the recesses and the protrusions can achieve separation between the first conductive regions 20 and the second conductive regions 30. In this case, the first conductive regions 20 may be disposed on some or all regions of the protrusions, as shown in FIG. 2, FIG. 4, and FIG. 5, which is configured according to actual usage needs.

Moreover, when the first conductive regions 20 are disposed inside the recesses and the second conductive regions 30 are disposed on the protrusions outside the recesses, the second conductive regions 30 may be disposed on some regions of the protrusions, so as not to be connected to the first conductive regions 20 inside the recesses, as shown in FIG. 1; and when the second conductive regions 30 are disposed on all regions of the protrusions, the depth of each recess is greater than the thickness of the first conductive regions 20 and the junction depth of the second conductive region 30, so that the first conductive regions 20 and the second conductive regions 30 are not connected to each other.

Figure 6:
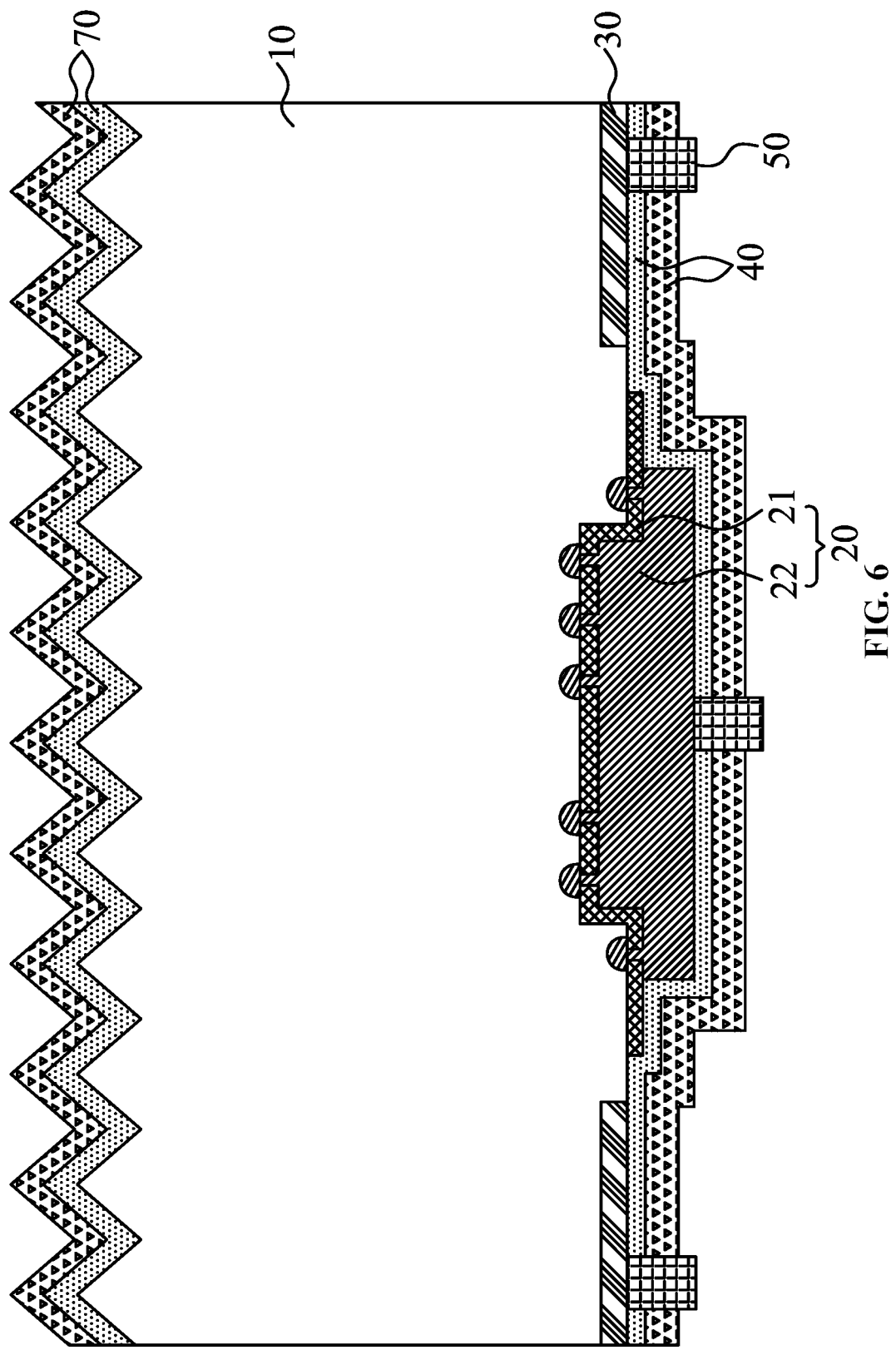

Furthermore, in one embodiment of the disclosure, the depth of each recess is set to 0.01-10 µm. Therefore, when the first conductive region 20 is disposed inside the recess, there may be a case where the total thickness of the first conductive region 20 may be greater than or less than or equal to the depth of the recess, i.e., the first conductive region 20 may be deposited merely inside the recess and may also extend out of the recess. In one embodiment of the disclosure, as shown in FIG. 6, when the second conductive regions 30 are disposed on some regions of the protrusions, the first dielectric layer 21 extends to cover regions between the first doped regions 22 and the second doped regions, and the thickness of the first conductive region 21 is greater than the depth of the recess, the first doped regions 22 may further extend to some regions of the protrusions and are not connected to the second doped regions. In this case, the first dielectric layer 21 and the first doped regions 22 disposed on the protrusion regions also form a passivated contact structure, and communicate with the first dielectric layer 21 and the first doped regions 22 in the recesses, thus increasing the contact area of the first dielectric layer 21 through which the current carriers selectively pass.

Figure 7:
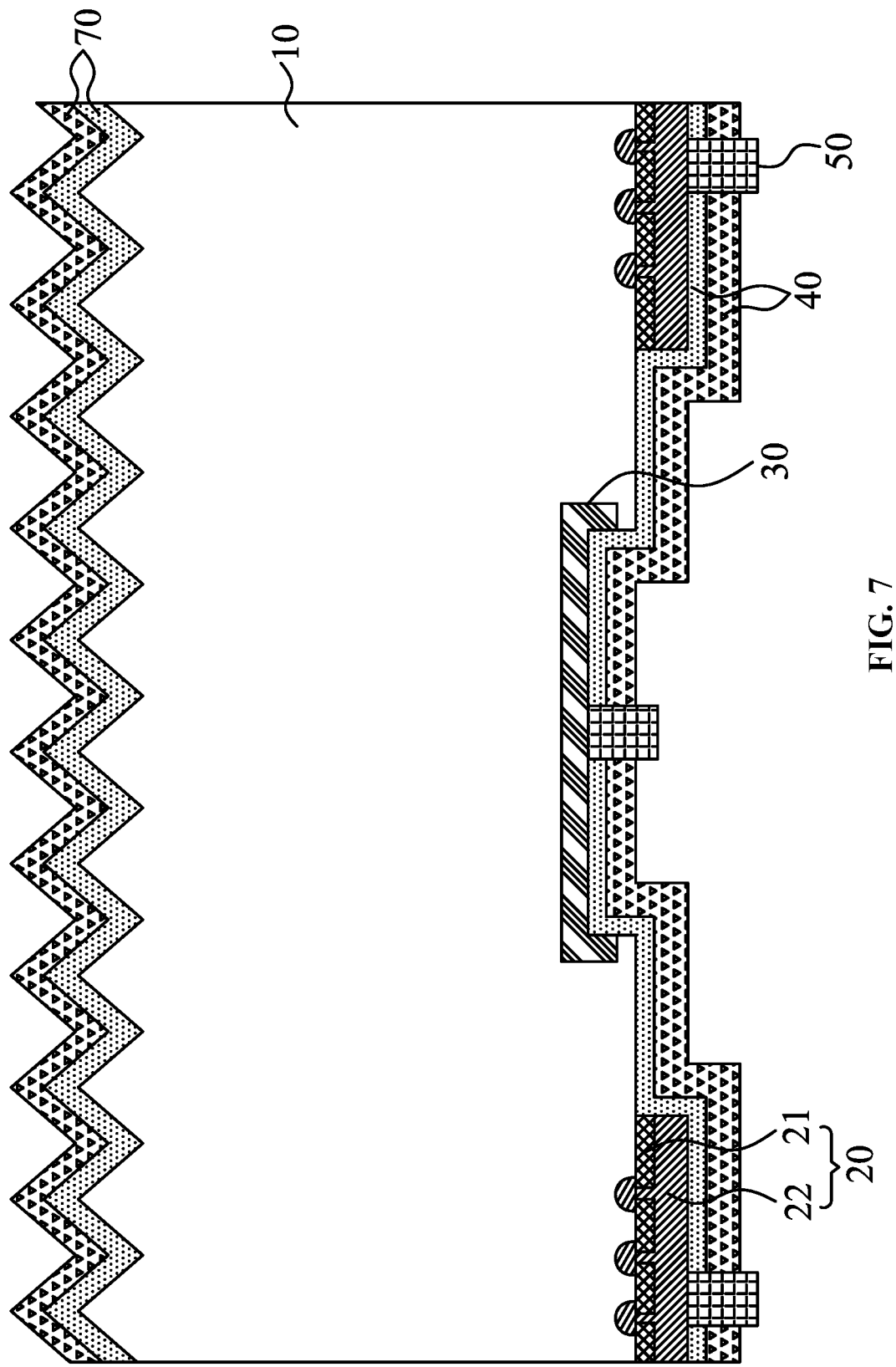

In addition, in one embodiment of the disclosure, as shown in FIG. 7, the second conductive regions 30 are disposed inside the recesses, when the silicon substrate 10 inside the recesses is diffused at the diffusion source to form the second doped region, the sidewalls of the recess may also be correspondingly diffused to form the second doped region, so that the second doped region extends to part of regions between the recesses. Therefore, in one embodiment of the disclosure, the first doped regions 22 and/or the second doped regions may extend to part of the regions between the recesses. That is, the first doped regions 22 extend out of the recesses to part of the regions between the recesses; or the second doped regions extend from the sidewalls of the recesses to part of the regions between the recesses; or the first doped regions 22 extend out of the recesses to part of the regions between the recesses, and at the same time, the second doped regions extend from the sidewalls of the recesses to part of the regions between the recesses.

When the first doped regions 22 are P-type doped regions, the width of the P-type doped region is 300-600 µm, and when the first doped regions 22 are N-type doped regions, the width of the N-type doped region is 100-500 µm. That is, when the first conductive regions 20 are disposed inside the recesses, the width of the recess is as stated above; and when the first conductive regions 20 are disposed on the protrusions, the width of the protrusion is at least greater than the value stated above, so that the first conductive regions 20 are disposed on some or all regions of the protrusions. In view of the above, the width control requirement of dozens of microns for the set recess width is looser as compared with the existing trenches; it would be easier to prepare it as compared with preparing the existing trenches. As a preferable embodiment of the disclosure, the width of the P-type doped region is preferably set to 500 µm, the width of the N-type doped region is preferably set to 300 µm, and the distance between the first conductive region 20 and the second conductive region 30 is preferably 100 µm.

Figure 8:
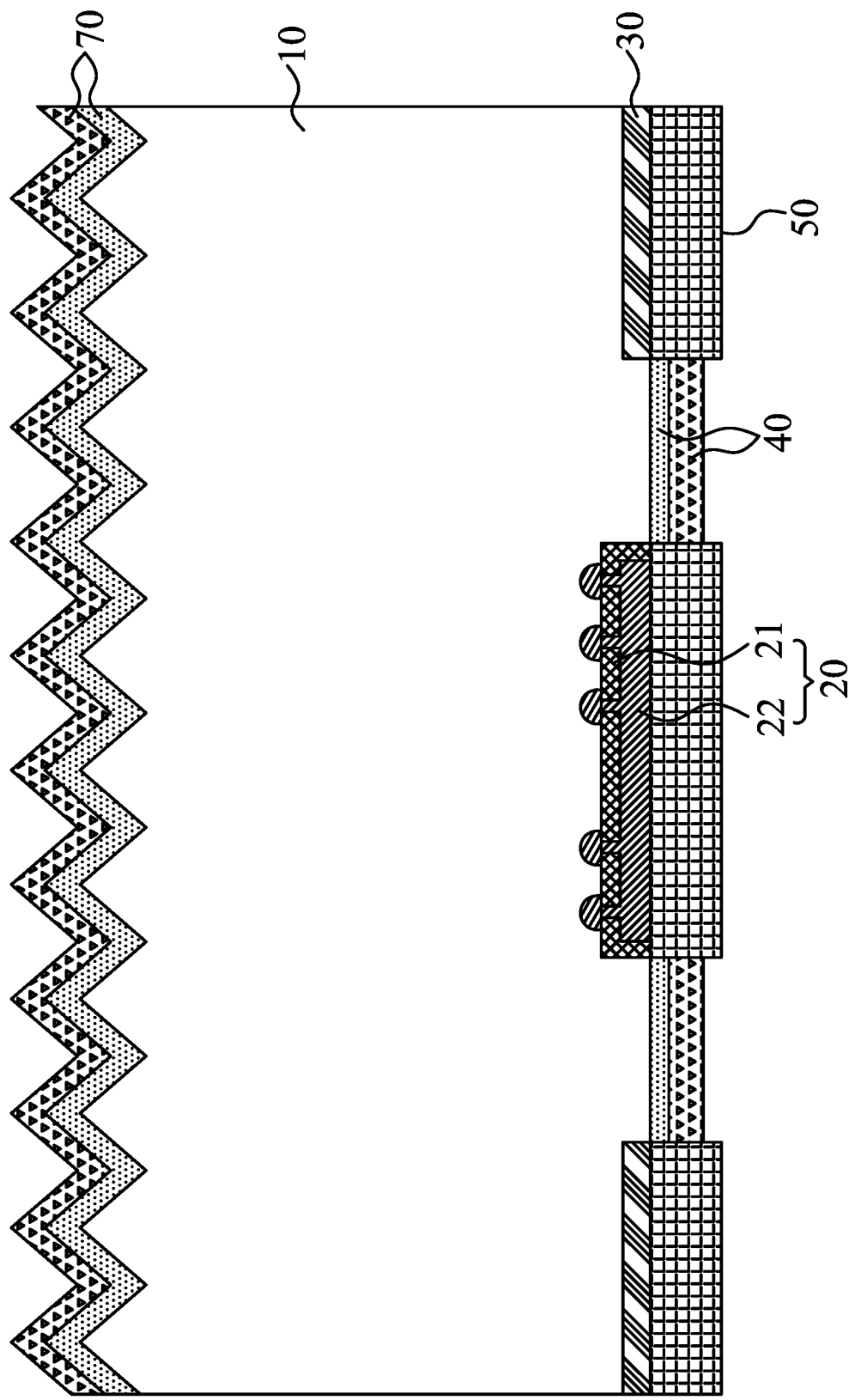
Figure 9:
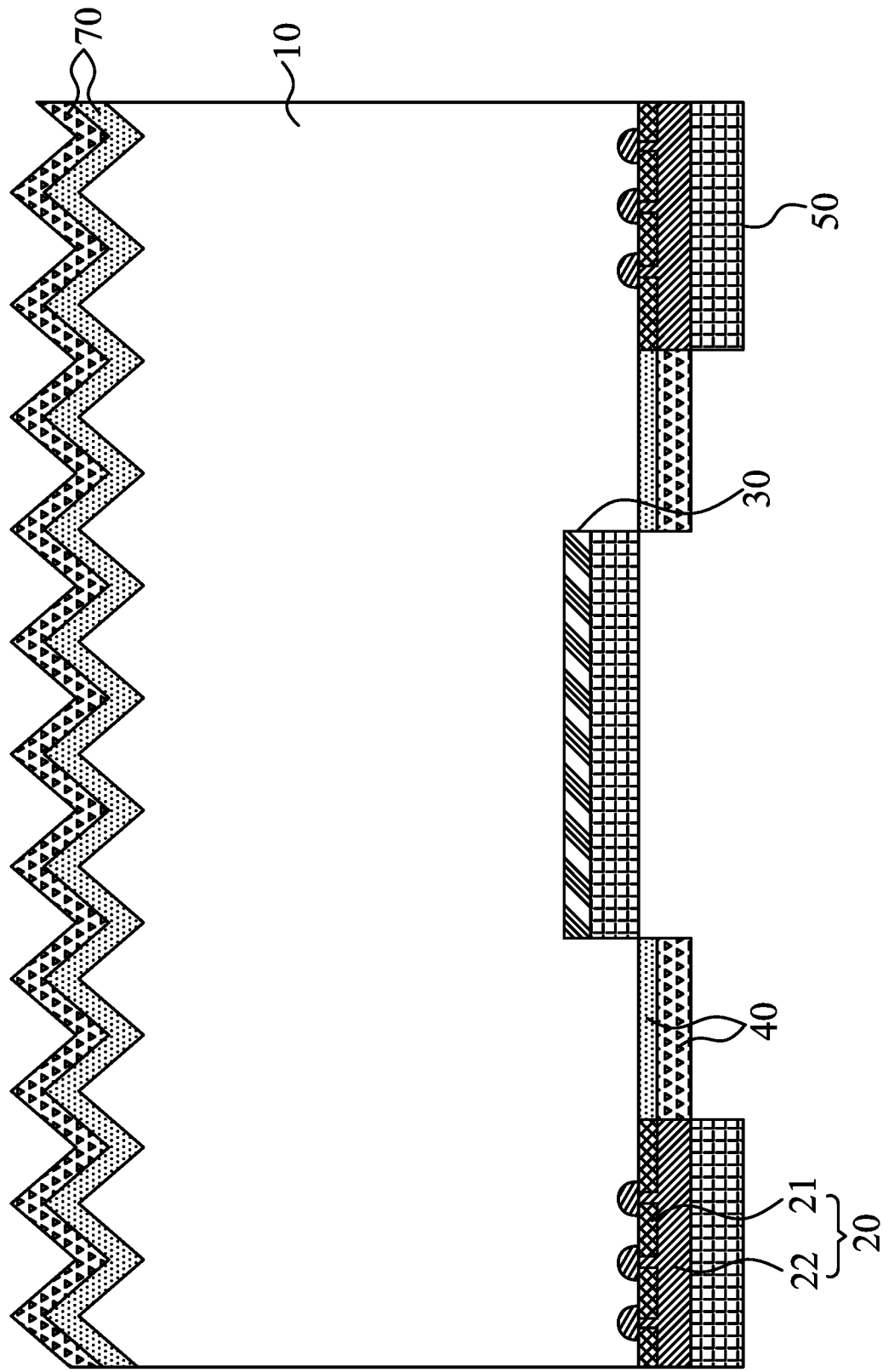

Furthermore, in one embodiment of the disclosure, the second dielectric layer 40 covers regions between the first conductive regions 20 and the second conductive regions 30, or extends to cover the first conductive regions 20 and/or the second conductive regions 30. That is to say, as shown in FIG. 8 and FIG. 9, the second dielectric layer 40 can merely cover the regions between the first doped regions 22 and the second doped regions; correspondingly, in this case, the conductive layer 50 covers the entire back of the first doped regions 22 and the first doped regions 22 for electrical connection. As shown in FIG. 1 and FIG. 2, the second dielectric layer 40 may further extend to cover the first doped regions 22 and/or the second doped regions. In this case, the conductive layer 50 covers the remaining part of the back that does not cover the second dielectric layer 40 in the first doped regions 22 and the second doped regions, to form electrical connections to the first doped regions 22 and the second doped regions, respectively. Certainly, during the preparing process of the second dielectric layer 40, the entire back of the back contact structure can also be completely covered, and in this case, when preparing the conductive layer 50, the conductive layer 50 penetrates through the second dielectric layer 40 by means of perforation or the like to form electrical connections to the first doped regions 22 and the second doped regions, respectively.

Furthermore, in one embodiment of the disclosure, the second dielectric layer 40 is preferably selected from one of an aluminum oxide layer, a silicon nitride layer, a silicon oxynitride layer, an intrinsic silicon carbide layer, an intrinsic amorphous silicon layer and a silicon oxide layer, or a combination thereof. The second dielectric layer 40 plays a passivation function and the second dielectric layer 40 is at least set as a one-layer structure; the refractive index of each layer is set to successively decrease outward from the silicon substrate 10, so that the film layer adjacent to the silicon substrate 10 plays a passivation function, while the film layer away from the silicon substrate 10 plays an anti-reflection function, to enhance the anti-reflection effect, thereby increasing the absorption and usage of light by the silicon substrate 10, to increase the short-circuit current density. In addition, the second dielectric layer 40 may further be a doped silicon layer (such as a doped microcrystalline silicon layer, a doped amorphous silicon layer, and a doped polycrystalline silicon layer), a doped silicon carbide layer (such as a doped polycrystalline silicon carbide layer), a doped silicon oxide layer (such as a doped polycrystalline silicon oxide and doped amorphous silicon oxide), etc. In addition, each film layer of a different structure in the second dielectric layer 40 may comprise a plurality of films with different refractive indexes, and according to the fact that the refractive index of each film layer is set to successively decrease outward from the silicon substrate 10, for example, the silicon oxide layer in the second dielectric layer 40 may comprise a plurality of silicon oxide film layers having the refractive index successively decreasing outward from the silicon substrate 10.

As stated above, for example, the second dielectric layer 40 may be a three-layer structure comprising the silicon oxide layer/aluminum oxide layer, intrinsic silicon carbide layer, and silicon nitride layer/silicon oxynitride layer; in this case, the thickness of the silicon oxide layer/aluminum oxide layer located at a first layer at an inner side is greater than 0.5 nm, the thickness of the intrinsic silicon carbide layer located at a second layer is greater than 1 nm, and the thickness of the silicon nitride layer/silicon oxynitride layer located at a third layer at an outer side is greater than 50 nm.

In certain embodiments, for example, the second dielectric layer 40 may further be a two-layer structure comprising the aluminum oxide layer, and silicon nitride layer/silicon oxynitride layer; in this case, the thickness of the aluminum oxide layer located at a first layer at an inner side is greater than 1 nm, and the thickness of the silicon nitride layer/silicon oxynitride layer located at a second layer at an outer side is greater than 50 nm.

In certain embodiments, for example, the second dielectric layer 40 may further be a three-layer structure comprising the silicon oxide layer/aluminum oxide layer, doped polycrystalline silicon layer/doped polycrystalline silicon carbide layer/doped polycrystalline silicon oxide layer, and silicon nitride layer/silicon oxynitride layer; in this case, the thickness of the silicon oxide layer/aluminum oxide layer located at a first layer at an inner side is 0.5-3 nm, the thickness of the doped polycrystalline silicon layer/doped polycrystalline silicon carbide layer/doped polycrystalline silicon oxide layer located at a second layer is 20-100 nm, and the thickness of the silicon nitride layer/silicon oxynitride layer located at a third layer at an outer side is greater than 50 nm.

In certain embodiments, for example, the second dielectric layer 40 may further be a three-layer structure comprising the intrinsic amorphous silicon layer, doped amorphous silicon layer/doped amorphous silicon oxide layer, and silicon nitride layer/silicon oxynitride layer; in this case, the thickness of the intrinsic amorphous silicon layer located at a first layer at an inner side is 2-10 nm, the thickness of the doped amorphous silicon layer/doped amorphous silicon oxide layer located at a second layer is 2-50 nm, and the thickness of the silicon nitride layer/silicon oxynitride layer located at a second layer at an outer side is greater than 50 nm.

In certain embodiments, for example, the second dielectric layer 40 may further be a three-layer structure comprising the silicon oxide/aluminum oxide layer, intrinsic silicon carbide layer/doped amorphous silicon oxide layer, and silicon nitride layer/silicon oxynitride layer; in this case, the thickness of the silicon oxide/aluminum oxide layer located at a first layer at an inner side is 0.5-3 nm, the thickness of the intrinsic silicon carbide layer/doped amorphous silicon oxide layer located at a second layer is 10-50 nm, and the thickness of the silicon nitride layer/silicon oxynitride layer located at a second layer at an outer side is greater than 50 nm.

As can be understood, the specific structure arrangement of the second dielectric layer 40 comprises, but not limited to, several specific examples listed above. In a preferable embodiment of the invention, as shown in FIG. 1 and FIG. 2, the second dielectric layer 40 is preferably a two-layer structure of an aluminum oxide layer and an intrinsic silicon carbide layer or a two-layer structure of a silicon oxide layer and an intrinsic silicon carbide layer, and in this case, the overall thickness of the second dielectric layer 40 is greater than 25 nm, where it is normally 70-80 nm during normal production and preparation. In this case, the intrinsic silicon carbide layer not only provides a hydrogen passivation effect, but also reduces parasitic light absorption due to a large optical band gap and a small absorption coefficient with respect to the intrinsic amorphous silicon layer and the doped polycrystalline silicon layer or the like. Furthermore, the thickness of the aluminum oxide layer or the silicon oxide layer in the second dielectric layer 40 is less than 25 nm, and the thickness of the intrinsic silicon carbide layer in the second dielectric layer 40 is greater than 10 nm. In the multi-layer structure indicated in the embodiment of the disclosure, the order thereof is to arrange outward from the silicon substrate 10. For example, when the second dielectric layer 40 above comprises the aluminum oxide layer and intrinsic silicon carbide layer, the aluminum oxide layer is close to the silicon substrate 10, while the intrinsic silicon carbide layer is close to the outer side. Meanwhile, in the accompanying drawings of the description, as shown in FIG. 1 to FIG. 13, it is only shown that the second dielectric layer 40 is a two-layer structure; as can be understood, the second dielectric layer 40 may further be other layer number, and the specific structure thereof is set according to actual needs and is not completely as shown in the accompanying drawings of the description. Meanwhile, each of the accompanying drawings of the description is merely used for describing each specific structure distribution in the back contact structure thereof, but it does not correspond to the actual size dimension of each structure. For example, the thickness of the first dielectric layer 21 above is 1-20 nm, and the thickness of the second dielectric layer 40 is greater than 25 nm; in the accompanying drawings, they do not completely correspond to the specific actual size dimensions in this embodiment, and should depend on the specific parameters provided in this embodiment.

Furthermore, the intrinsic silicon carbide layer in the second dielectric layer 40 comprises at least one first intrinsic silicon carbide film having a different refractive index. The refractive index of each first intrinsic silicon carbide film successively decreases outward from the back surface of the silicon substrate 10. Optionally, the refractive index of each material is generally selected as: the refractive index of monocrystalline silicon is 3.88; the refractive index of amorphous silicon is 3.5-4.2; the refractive index of polycrystalline silicon is 3.93; the refractive index of silicon carbide is 2-3.88; the refractive index of silicon nitride is 1.9-3.88; the refractive index of silicon oxynitride is 1.45-3.88; the refractive index of silicon oxide is 1.45; and the refractive index of aluminum oxide is 1.63. As can be understood, the refractive index of each material above may further be set as others according to actual usage needs, and is not specifically limited herein.

Furthermore, in one embodiment of the disclosure, a magnesium fluoride layer is disposed at an outer layer of the second dielectric layer 40, i.e., based on the one of an aluminum oxide layer, a silicon nitride layer, a silicon oxynitride layer, an intrinsic silicon carbide layer, an intrinsic amorphous silicon layer and a silicon oxide layer, or a combination thereof selected by the second dielectric layer 40, the magnesium fluoride layer can further be disposed at the outer layer of the second dielectric layer 40. The refractive index requirement for the magnesium fluoride layer is the lowest, and generally, the refractive index thereof is set as 1.4, for enhancing the optical function of anti-reflection.

Furthermore, in one embodiment of the disclosure, the conductive layer 50 is a TCO transparent conductive film and/or a metal electrode. The metal electrode comprises a silver electrode, a copper electrode, an aluminum electrode, a tin-clad copper electrode, or a silver-clad copper electrode. Furthermore, the copper electrode is electro-plated copper prepared through an electroplating process or a copper electrode prepared through physical vapor deposition. The electro-plated copper uses nickel, chromium, titanium, and tungsten electrodes as a seed layer or a protection layer thereof Furthermore, in one embodiment of the disclosure, the recess is an arc, a trapezoid, or a square. As shown in FIG.

Figure 10:
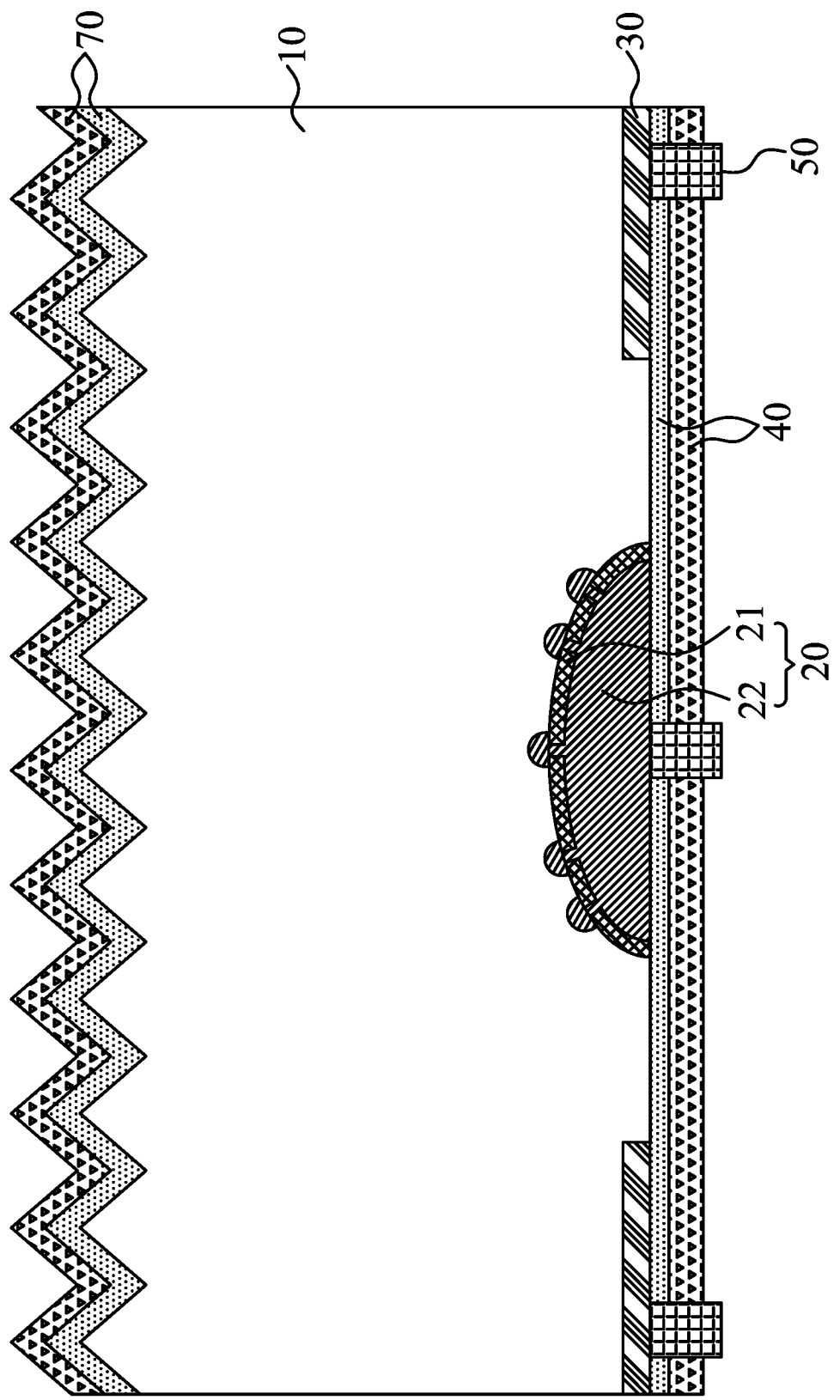
Figure 11:
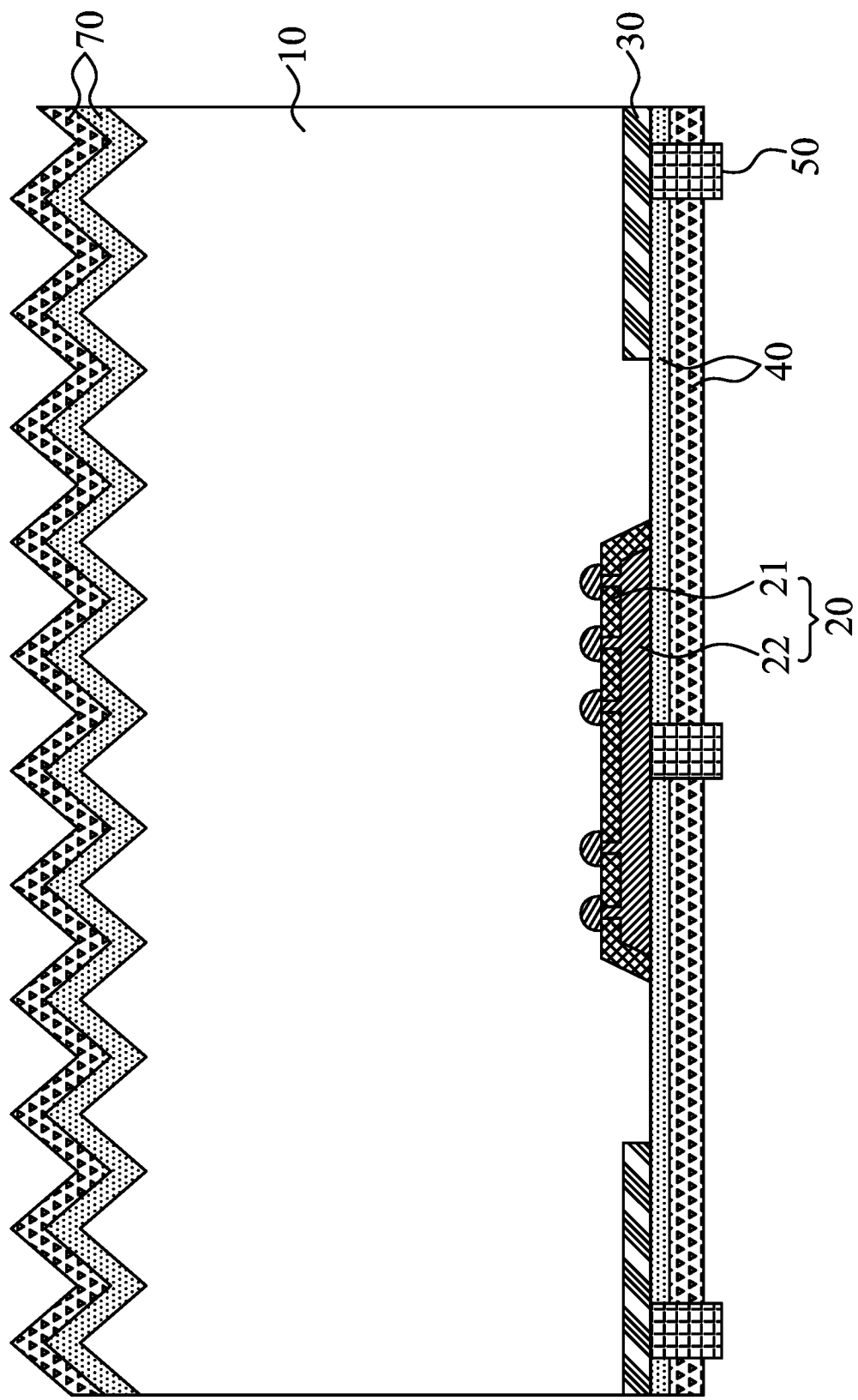

1 and FIG. 2, in a specific embodiment, the recess is a square. As shown in FIG. 10, in another specific embodiment, the recess where the first conductive region 20 is disposed is an arc. As shown in FIG. 11, in another specific embodiment, the recess where the first conductive region 20 is disposed is a trapezoid. It can be understood that the second conductive region 30 can also be disposed inside the arc-shaped recess or the trapezoidal recess. The recess is preferably to be set as an arc or a trapezoid, because when the recess is set as an arc or a trapezoid, an effect of reflecting light by the inner wall of the recess is better, and the surface area of the first dielectric layer 21 specifically as the tunneling structure in contact with the silicon substrate 10 can further be increased when the first conductive regions 20 are disposed inside the recesses. Certainly, when the recess is set as a square, the actual production process is simpler. Therefore, the shape of the recess is correspondingly set according to actual usage needs, which is not specifically limited herein.

In other embodiments of the disclosure, it is possible that the first dielectric layer 21 is connected to the bottom walls of the recesses and the second dielectric layer 40 is further connected to the sidewalls of the recesses when the first conductive regions 20 are disposed inside the recesses. This is mainly because that the recess region is covered using the mask, and then when the mask is removed in a subsequent process, silicon in part of the silicon substrate 10 near the first doped region 22 will be corroded to widen the recess; and when the second dielectric layer 40 is deposited in a subsequent process, the second dielectric layer 40 will be deposited in a blank region, so that the second dielectric layer 40 is connected to the sidewall of the recess. Or, when an arc-shaped recess (such as an ellipsoid-shaped recess) is prepared, there may be a case where the first dielectric layer 21 and the first doped region 22 cannot be deposited onto the inner wall of the arc-shaped recess in the long-axis direction, and thus the blank region may be filled with the second dielectric layer 40 during deposition thereof so that the second dielectric layer 40 is connected to the sidewall of the arc-shaped recess, or there may be another case where the second dielectric layer 40 cannot be deposited to the blank region during deposition so that a certain gap is formed between the sidewall of the arc-shaped recess and the first dielectric layer 21 and the first doped region 22. Absolutely, in the back contact structure of the embodiments of the disclosure, it is preferable that the first dielectric layer 21 is directly connected to the sidewall of the recess, so that the first dielectric layer 21 disposed on the sidewall of the recess can allow selective pass-through of the current carriers to achieve multi-dimension collection.

Figure 12:
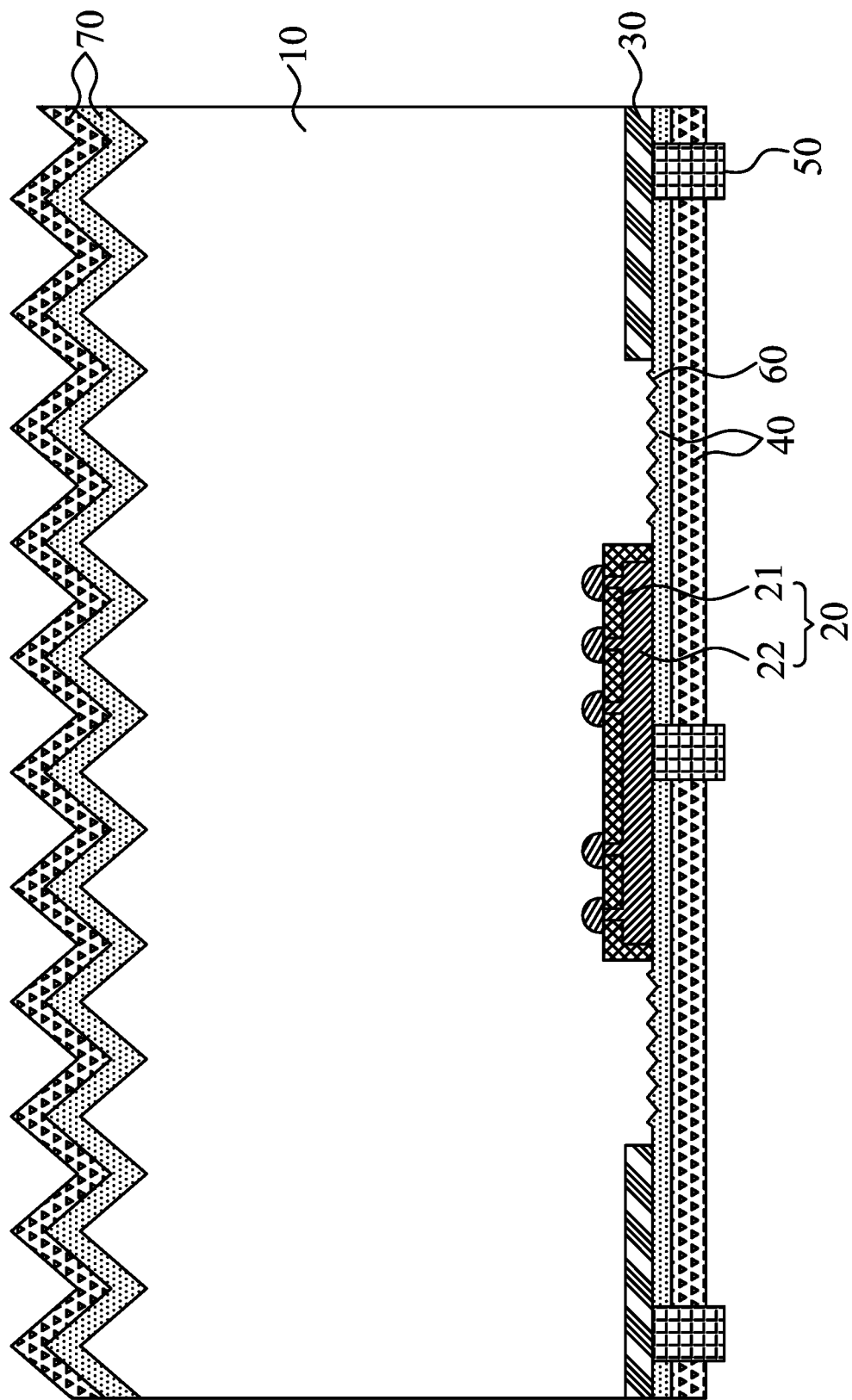
Figure 13:
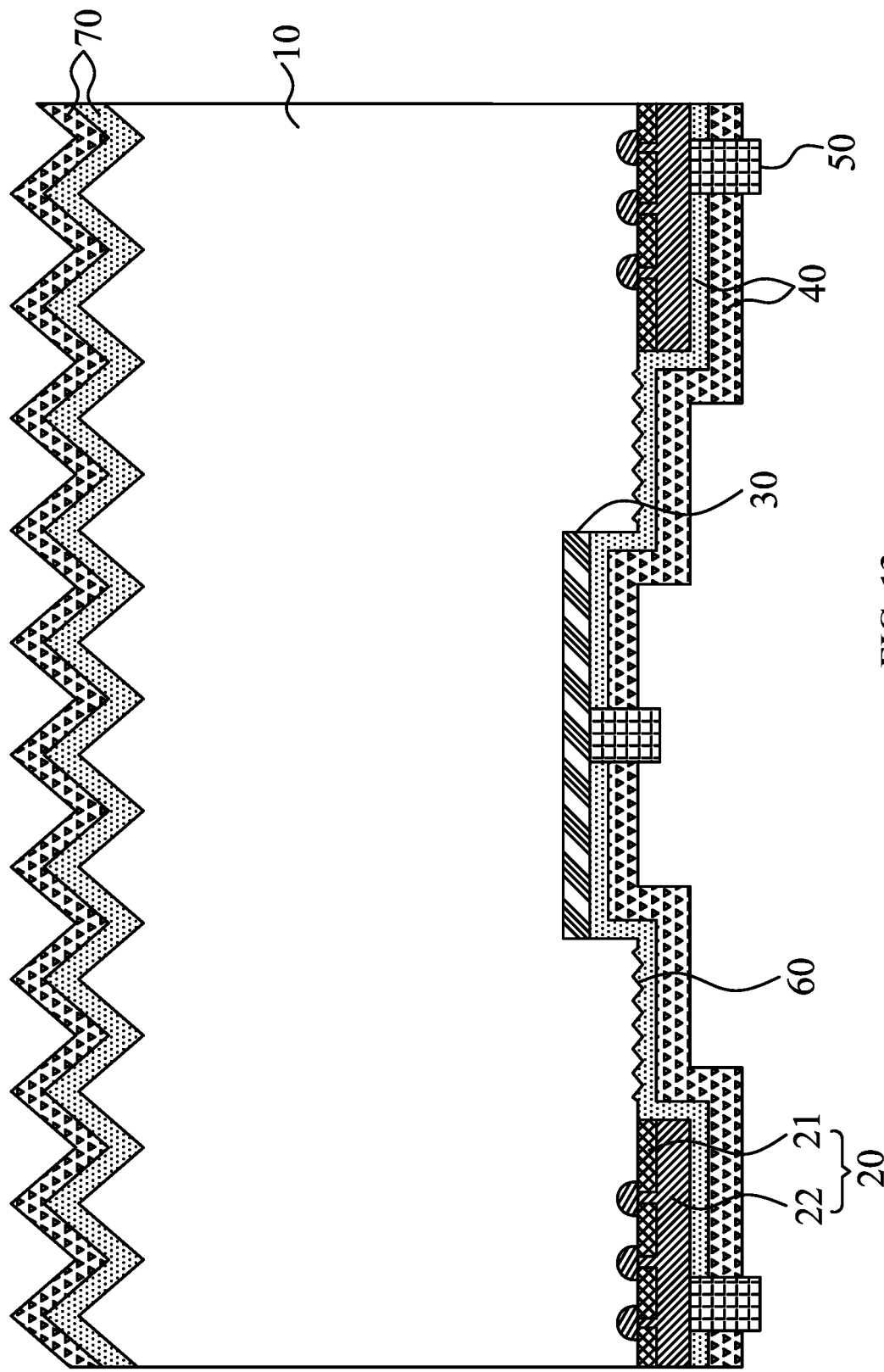

Furthermore, in one embodiment of the disclosure, as shown in FIG. 12 and FIG. 13, when the first conductive regions 20 are disposed on the protrusions outside the recesses or the second conductive regions 30 are disposed on some regions of the protrusions, the back surface of the silicon substrate 10 located on regions between the first conductive regions 20 and the second conductive regions 30 comprises a rough texture structure 60. The rough texture structure 60 is generally made through texturing, comprising forming hemispherical textures through acid texturing and forming pyramid-shaped textures through alkaline texturing, or forming pyramid-shaped textures through alkaline texturing and then performing rounding treatment on pyramid apexes through acid texturing.

By tests, with respect to a cell prepared in an existing trench manner in a control group, the cell conversion efficiency of the cell prepared from the back contact structure provided in the embodiments of the disclosure in an experiment group can be effectively improved to about 25.6% and the reliability is greatly improved. Electrical performance results are shown in Table 1 below:

TABLE 1

| Name | UOC | JSC | FF | EF |
| --- | --- | --- | --- | --- |
| Experiment group | 726 | 41.7 | 84.5% | 25.6% |
| Control group | 720 | 41.6 | 84.3% | 25.2% |

The embodiment of the disclosure has the following beneficial effects with respect to the related art:

1. Recesses are disposed at intervals on a back surface of a silicon substrate, and first conductive regions are disposed inside or outside the recesses and the second conductive regions are disposed outside or inside the recesses in an alternate manner, so that separation between the first conductive regions and the second conductive regions is implemented through some recesses or some protrusions outside the recesses; moreover, the recesses disposed have a lower width control requirement than existing trenches, and preparation of the recesses is easier than preparation of the existing trenches.

2. Since the arrangement of the recesses enables the first dielectric layer to be in contact with both bottom walls and sidewalls of the recesses when the first conductive regions are disposed inside the recesses, current carriers generated on the silicon substrate would also be easily separated through the first dielectric layer on the sidewalls of the recesses and selectively collected into the corresponding first doped regions, so that leakage current can be reduced and selective transport of the current carriers in longitudinal and transverse directions can also be implemented, thereby facilitating multi-dimensional collection of the current carriers on the bottom walls and sidewalls of the recesses.

3. Since the second dielectric layer disposed is at least one in number, passivation is performed on the back surface of the silicon substrate through the second dielectric layer having at least one layer and the first dielectric layer to bring a better passivation effect; and by controlling the refractive index of each layer to successively decrease outward from the silicon substrate, the inner back reflection of light in the long wave band at the silicon substrate can be improved, to increase a short-circuit current density.

4. A recess has a specific depth, and the hard mask is only in direct contact with the protrusion portion between two recesses so that the hard mask will not be in direct contact with the bottom of the recess to reduce impurity contamination, so that the hard mask yields a certain protection effect on the silicon substrate on the bottom wall of the recess, there is no need to worry that the hard mask will cause damage to the silicon substrate, and the damage caused by contact of the hard mask with the surface of the protrusion of the silicon substrate can also be eliminated in the subsequent texturing process.

5. In the process that the hard mask is used to selectively deposit the first doped regions, since the recesses are separated by the silicon substrate protrusion structure having a specific width, when the hard mask is used for covering and performing deposition in a recess region, accurate alignment of the hard mask is not required and a moderate amount of deviation is allowed, so that the alignment of the hard mask gets simpler and then the technological difficulty is reduced.

6. In the related art, due to width and depth limitations to a trench region, a chemical solution cannot completely infiltrate the bottom of the trench for chemical wet texturing due to hydrophobicity of water and a silicon slice. However, in this embodiment, since the recesses are disposed and the back surface of the silicon substrate between adjacent recesses is the boss, it would be easier to obtain the rough texture structure by texturing than existing trench structures; moreover, reflection of light on the inner back surface of the silicon substrate is enhanced after the protrusions on the back surface of the silicon substrate are textured, thereby increasing the light absorption rate of the silicon substrate.

Embodiment 2

The second embodiment of the disclosure provides a selective contact region buried solar cell. To facilitate explanation, merely the parts related to the embodiment of the disclosure are illustrated. With reference to FIG. 1 to FIG. 13, the selective contact region buried solar cell provided by the embodiment of the disclosure comprises:

a silicon substrate 10;

the back contact structure disposed on a back surface of the silicon substrate 10 as stated in the foregoing embodiment; and a third dielectric layer 70 disposed on a front surface of the silicon substrate 10.

Furthermore, in one embodiment of the disclosure, the second dielectric layer 40 and the third dielectric layer 70 may be respectively prepared on the front and back surface of the silicon substrate 10 through the same process. In this case, the third dielectric layer 70 may have the same structure as the second dielectric layer 40 in the foregoing embodiment. Therefore, with reference to the foregoing embodiment, preferably, the third dielectric layer 70 may also be selected from one of an aluminum oxide layer, a silicon nitride layer, a silicon oxynitride layer, a silicon carbide layer, an intrinsic amorphous silicon layer and a silicon oxide layer, or a combination thereof.

As some examples of the disclosure, the third dielectric layer 70 may further have a three-layer structure comprising the silicon oxide layer/aluminum oxide layer and the doped polycrystalline silicon layer/doped polycrystalline silicon carbide layer/doped polycrystalline silicon oxide layer and the silicon nitride layer/silicon oxynitride layer, or a three-layer structure comprising the intrinsic amorphous silicon layer and the doped amorphous silicon layer/doped amorphous silicon oxide layer and the silicon nitride layer/silicon oxynitride layer, or a three-layer structure comprising the silicon oxide layer/aluminum oxide layer and the intrinsic silicon carbide layer/doped amorphous silicon oxide layer and the silicon nitride layer/silicon oxynitride layer.

Furthermore, in one preferable embodiment of the disclosure, with reference to FIG. 1, preferably, the third dielectric layer 70 also correspondingly has a two-layer structure comprising the silicon oxide layer and the silicon carbide layer, or a two-layer structure comprising the aluminum oxide layer and the silicon carbide layer, and the thickness of the third dielectric layer 70 is greater than 50 nm. The thickness of the aluminum oxide layer or the silicon oxide layer in the third dielectric layer 70 is less than 40 nm, and the thickness of the silicon carbide layer in the third dielectric layer 70 is greater than 10 nm. In this case, the silicon carbide layer not only provides a hydrogen passivation effect, but also reduces parasitic light absorption due to a large optical band gap and a small absorption coefficient with respect to the intrinsic amorphous silicon layer and the doped polycrystalline silicon layer or the like. Furthermore, the silicon carbide layer in the third dielectric layer 70 comprises at least one silicon carbide film having a different refractive index. The refractive index of each silicon carbide film successively decreases outward from the front surface of the silicon substrate 10. Furthermore, in one embodiment of the disclosure, a magnesium fluoride layer is disposed at an outer layer of the third dielectric layer 70. The refractive index requirement for the magnesium fluoride layer at the outermost layer is the lowest, and generally, the refractive index is set as 1.4, for enhancing the optical function of anti-reflection.

Certainly, the third dielectric layer 70 may have a structural arrangement different from the second dielectric layer 40 in the foregoing embodiment, and the film structures of the second dielectric layer 40 and the third dielectric layer 70 are correspondingly set according to actual usage needs, which is not specifically limited herein.

Furthermore, in one embodiment of the disclosure, an electric field layer or a floating junction is further disposed between the front surface of the silicon substrate 10 and the third dielectric layer 70, specifically comprising performing phosphorus diffusion on the silicon substrate 10 to obtain the electric field layer or performing boron diffusion to obtain the floating junction. In this case, the electric field layer or the floating junction serves as a Front-Surface Field (FSF) of the selective contact region buried solar cell.

In this embodiment, recesses are disposed at intervals on a back surface of a silicon substrate, and first conductive regions are disposed inside or outside the recesses and the second conductive regions are disposed outside or inside the recesses in an alternate manner, so that separation between the first conductive regions and the second conductive regions is implemented through some recesses or some protrusions outside the recesses; moreover, the recesses disposed have a lower width control requirement than existing trenches, and preparation of the recesses is easier than preparation of the existing trenches. In addition, since the arrangement of the recesses enables the first dielectric layer to be in contact with both bottom walls and sidewalls of the recesses when the first conductive regions are disposed inside the recesses, current carriers generated on the silicon substrate would also be easily separated through the first dielectric layer on the sidewalls of the recesses and selectively collected into the corresponding first doped regions, so that leakage current can be reduced and selective transport of the current carriers in longitudinal and transverse directions can also be implemented, thereby facilitating multi-dimensional collection of the current carriers on the bottom walls and sidewalls of the recesses. Since a second dielectric layer disposed is at least one in number, multi-layer passivation is achieved on the back surface of the silicon substrate through the second dielectric layer having at least one layer, and then a better passivation effect is yielded and inner back reflection is enhanced, thereby yielding a better passivation effect and a better inner back reflection effect and solving the existing problems of a high trench width control requirement and a poor passivation effect.

Embodiment 3

Figure 14:
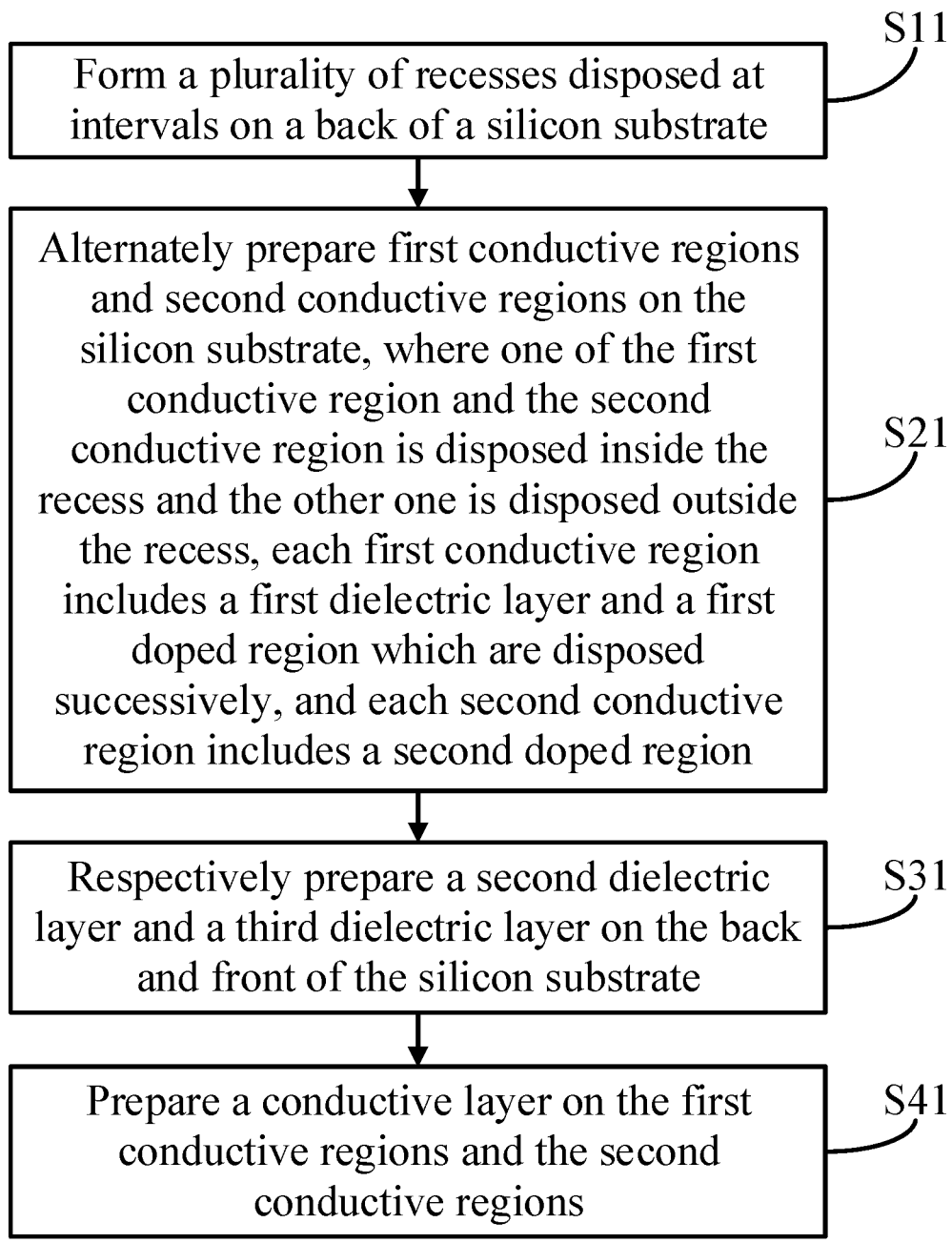
FIG. 14 is a flow chart of a selective contact region buried solar cell manufacturing method of another embodiment of the disclosure.

The third embodiment of the disclosure provides a selective contact region buried solar cell manufacturing method. To facilitate explanation, merely the parts related to the embodiment of the disclosure are illustrated. With reference to FIG. 14, the selective contact region buried solar cell manufacturing method provided by the embodiment of the disclosure is used for preparing the selective contact region buried solar cell as stated in the preceding embodiment, and specifically, the method comprises the following steps.

At S11, a plurality of recesses is formed at intervals on a back surface of a silicon substrate.

Before S11, the method further comprises pre-treating the silicon substrate.

The pre-treatment above comprises cleaning the silicon substrate and removing a damaged layer. Specifically, the pre-treatment comprises:

(1) performing RCA standard cleaning to remove particles, organic matters, or the like on the surface of the silicon substrate;

(2) placing the cleaned silicon substrate in a 2-5% potassium hydroxide (KOH) solution or tetramethylammonium hydroxide (TMAH) solution (i.e., a developing solution) for treatment at a temperature of 50-80° C. for 1-5 min, to remove a surface damaged layer caused in a slicing process;

(3) performing pickling on the surface of the silicon substrate using HCl, to neutralize the alkaline solution left on the surface of the silicon substrate and remove metal impurities left on the surface of the silicon slice; and (4) cleaning the silicon substrate using an HF solution, to remove a silicon oxide layer on the surface of the silicon slice and form a Si—H passivation bond with a dangling bond on the surface of the silicon substrate, and finally, performing drying using nitrogen for use.

Furthermore, after the silicon substrate is pre-treated, the recesses may be formed in the following ways:

way I: the part where the recesses need to be disposed at intervals is directly slotted through laser and partial silicon crystal is removed from the back surface of the silicon substrate, to form the desired recesses; way II: the silicon substrate is subjected to thermal oxidation treatment so that a silicon oxide layer is formed on the entire surface of the silicon substrate, silicon oxide in part of the regions on the front and back surface of the silicon substrate is removed through laser slotting, and then silicon oxide is removed using an acid (such as HF) through wet etching, to form the desired recesses; way III: a silicon nitride layer is deposited on the back surface of the silicon substrate through PECVD, silicon nitride in part of the region on the back is removed through laser slotting, and then silicon nitride is removed through wet etching, to form the desired recesses; way IV, silicon nitride is deposited on the back surface of the silicon substrate or the silicon substrate is subjected to thermal oxidation treatment to form silicon oxide, a photoresist mask is then deposited on the back, developing is enabled on a developing region through exposure using a patterned screen, the developing region is removed with a wet method using a developing agent, silicon nitride/silicon oxide in the developing region is removed using an acid (such as HF), and the photoresist mask and silicon nitride/silicon oxide are removed through wet etching, to form the desired recesses; and way V: a patterned paste is printed on the back surface of the silicon substrate as a mask, and the paste is then removed through wet etching, to form the desired recesses.

In the embodiment of the disclosure, way II is preferably used for forming the recesses, where in way II, the thermal oxidation treatment step specifically comprises: performing dry-oxygen oxidation/steam oxidation/wet-oxygen oxidation (i.e., dry-oxygen+steam) in a quartz tube, where specific reactants comprise oxygen and/or high-purity steam, the reaction pressure is 50-1000 mbar, the reaction temperature is 900-1200° C., and the thickness of silicon oxide prepared from the reaction is greater than 10 nm. The step of removing silicon oxide through laser slotting specifically comprises: removing silicon oxide to be removed through slotting by laser having a laser wavelength of 532 nm, a laser power of 10-60 W, a laser frequency less than or equal to 250-1500 KHz, and a laser pulse width of 3-50 ns. An alkaline solution and isopropyl acetone are used in the wet etching step, where the alkaline solution is KOH or TMAH, the concentration of the alkaline solution is 1-5%, the content of isopropyl acetone is 1-10%, the reaction temperature is 60-85° C., and the reaction time is 10-30 min. An acidic solution in the step of removing silicon oxide using the acid is HF, where the concentration of the acidic solution is 1-5%, the reaction temperature is room temperature, and the reaction time is 3-10 min.

Specifically, after the recess is formed through way II, the depth of the formed recess is 0.01-10 μm. The formed recess may be an arc, a trapezoid, or a square. Since trenches used in the related art are prepared by laser perforation or wet etching, the width control requirement for the trenches is high and it is difficult to prepare. However, preparation of the recesses in this embodiment is easier than preparation of existing trenches, and does not have a strict width control requirement as the existing trenches.

At step S21, first conductive regions and second conductive regions are prepared alternately on the silicon substrate, where one of the first conductive region and the second conductive region is disposed inside the recess and the other one is disposed outside the recess, each first conductive region comprises a first dielectric layer and a first doped region which are disposed successively, and each second conductive region comprises a second doped region;

Before step S21, the specific production process may further comprise texturing the front surface of the silicon substrate. In this embodiment, texturing on the front is mainly achieved by corrosion using an alkaline solution, where the alkaline solution reacts with the silicon substrate to generate a water-soluble compound, and a pyramid-shaped textured structure is formed on the surface. In this case, due to the existence of the textured structure, after incident light is reflected by the textured surface for the first time, reflected light does not directly enter the air, but enters the air after encountering the adjacent textured surface and being reflected by the textured surface for the second time or even for the third time. Therefore, the incident light is used for multiple times, thereby reducing the reflectivity of the front. When the back surface of the silicon substrate also needs to have a rough texture structure, the front and back surface of the silicon substrate can be textured at the same time; and when the back surface of the silicon substrate does not need to have a rough texture structure, a silicon nitride protection layer is deposited on the back surface of the silicon substrate, the front is then textured, and the silicon nitride protection layer is removed from the back through laser, thereby avoiding texturing on the back surface of the silicon substrate.

The alternately preparing first conductive regions and second conductive regions on the silicon substrate is implemented in the following steps:

successively preparing the first dielectric layer and the first doped region having a first conductivity type inside or outside a recess; and preparing the second doped region having a second conductivity type outside or inside the corresponding recess, where the first conductivity type is opposite to the second conductivity type.

The first conductive regions and the second conductive regions are respectively disposed at different positions inside and outside the recesses, where specifically, when the first conductive region comprising the first dielectric layer and the first doped region is disposed inside the recess, the second conductive region comprising the second doped region is disposed outside the recess; and correspondingly, when the first dielectric layer and the first doped region are disposed outside the recess, the second doped region is disposed inside the recess. In addition, the first doped region and the second doped region have opposite conductivity types, where if the first doped region is a P-type doped region, the second doped region is correspondingly an N-type doped layer; or if the first doped region is an N-type doped region, the second doped region is correspondingly a P-type doped layer.

Since the step of preparing the first conductive regions and the second conductive regions disposed alternately cannot be implemented at the same time through a technological process, the first conductive regions are prepared before the preparation of the second conductive regions, or the second conductive regions are prepared before the preparation of the first conductive regions. Accordingly, the order of preparing the first conductive regions and the second conductive regions is set in consideration of the convenience of an actual technological process, which is not specifically limited herein. Preferably, in this embodiment, the first conductive regions are prepared inside or outside the recesses, and then the second conductive regions are prepared outside or inside the corresponding recesses.

Furthermore, the successively preparing the first dielectric layer and the first doped region having a first conductivity type inside or outside the recess specifically refers to preparing the first dielectric layer inside or outside the recess and then performing in-situ deposition or ex-situ deposition on the first dielectric layer to prepare the first doped region having the first conductivity type.

Specifically, the first dielectric layer is prepared according to a high-temperature oxidation process, a deposition process or the like, which is set depending on the type of the first dielectric layer to be specifically deposited and is not specifically limited therein. In this case, the first dielectric layer is one of a tunneling oxide layer, an intrinsic silicon carbide layer and an intrinsic amorphous silicon layer, or a combination thereof, and the thickness of the first dielectric layer is 1-20 nm.

Specifically, in one embodiment of the disclosure, when in-situ deposition is used for the prepared first doped region, the step of preparing the first doped region on the first dielectric layer comprises:
depositing the first conductivity type of doped amorphous silicon or doped amorphous silicon carbide on the first dielectric layer; and
performing high-temperature crystallization treatment, so that the doped amorphous silicon or the doped amorphous silicon carbide is changed into doped polycrystalline silicon or doped silicon carbide to obtain the first doped region having the first conductivity type.

In a feasible solution, when the first conductive regions are disposed inside/outside the recesses and the first doped region in the first conductive region is the P-type doped region, when in-situ deposition of the P-type doped region is performed, the protrusions outside the recess/the recesses in which deposition is not needed are shielded with a mask method. In this case, in-situ deposition of P-type amorphous silicon/P-type amorphous silicon carbide is performed inside/outside the recesses, and then the temperature is increased to 700-1000° C. directly using a high-temperature or laser heating method. Therefore, after high-temperature crystallization treatment, the P-type amorphous silicon/P-type amorphous silicon carbide inside/outside the recesses is changed into P-type polycrystalline silicon/P-type silicon carbide, to obtain the P-type doped region, i.e., the first doped region having the first conductivity type. The mask may be a hard mask, a silicon nitride mask, a silicon oxide mask, and a photoresist mask.

Specifically, in one embodiment of the disclosure, when ex-situ deposition is used for the prepared first doped region, the step of preparing the first doped region on the first dielectric layer comprises:
depositing intrinsic amorphous silicon or intrinsic silicon carbide on the first dielectric layer;
performing the first conductivity type of doping on the intrinsic amorphous silicon or the intrinsic silicon carbide; and
performing high-temperature crystallization treatment, so that the intrinsic amorphous silicon or the intrinsic silicon carbide is changed into doped polycrystalline silicon or doped silicon carbide to obtain the first doped region having the first conductivity type.

The step of performing the first conductivity type of doping on the intrinsic amorphous silicon or the intrinsic silicon carbide specifically comprises:
injecting the first conductivity type of ions onto the intrinsic amorphous silicon or the intrinsic silicon carbide for doping; or
depositing the first conductivity type of doping sources on the intrinsic amorphous silicon or the intrinsic silicon carbide for doping; or
introducing the first conductivity type of source gas onto the intrinsic amorphous silicon or the intrinsic silicon carbide for doping.

In a feasible solution, specifically, intrinsic amorphous silicon or intrinsic silicon carbide is deposited on the first dielectric layer; then the first conductivity type of ions are injected onto the intrinsic amorphous silicon or intrinsic silicon carbide for doping (when the first doped region is the P-type doped region, P-type ions containing elements boron, aluminum, gallium or the like are injected, and when the first doped region is the N-type doped region, N-type ions containing elements nitrogen, phosphorus, arsenic or the like are injected), or the first conductivity type of doping source is deposited, with a mask method, onto the intrinsic amorphous silicon or intrinsic silicon carbide for doping (when the first doped region is the P-type doped region, a P-type doping source containing boron, aluminum, gallium or the like (such as borosilicate glass) is deposited for doping to form P-type amorphous silicon/P-type silicon carbide, and when the first doped region is the N-type doped region, an N-type doping source containing nitrogen, phosphorus, arsenic or the like (such as phosphosilicate glass) is deposited for doping to form N-type amorphous silicon/N-type silicon carbide), or the first conductivity type of source gas is introduced, with a mask method, onto the intrinsic amorphous silicon or intrinsic silicon carbide for doping (when the first doped region is the P-type doped region, a P-type source gas containing elements boron, aluminum, gallium or the like (such as a borane gas or a carrier gas carrying boron trichloride or boron tribromide) is introduced for doping to form P-type amorphous silicon/P-type silicon carbide, and when the first doped region is the N-type doped region, an N-type source gas containing nitrogen, phosphorus, arsenic or the like (such as a phosphorane gas or a carrier gas carrying phosphorus oxychloride) is introduced for doping to form N-type amorphous silicon/N-type silicon carbide); and further, after the doping is completed, high-temperature crystallization treatment is performed so that the original intrinsic amorphous silicon or intrinsic silicon carbide is changed into doped polycrystalline silicon or doped silicon carbide, to obtain the first doped region having the first conductivity type. Since in deposition with intrinsic amorphous silicon/intrinsic silicon carbide, deposition may be performed on the sides and front surface of the silicon substrate, after high-temperature crystallization, it is required to add wet etching treatment to achieve bypass plating. In addition, after the first conductivity type of doping source is deposited for doping and after high-temperature crystallization treatment is completed, it is also required to remove the doping source through laser or the like.

Specifically, in another embodiment of the disclosure, when ex-situ deposition is used for the prepared first doped region, the step of preparing the first doped region on the first dielectric layer further comprises:

depositing intrinsic amorphous silicon or intrinsic silicon carbide on the first dielectric layer; and performing the first conductivity type of diffusion on the intrinsic amorphous silicon or the intrinsic silicon carbide, so that the intrinsic amorphous silicon or the intrinsic silicon carbide is changed into doped polycrystalline silicon or doped silicon carbide to obtain the first doped region having the first conductivity type.

In the process of preparing the first doped regions, since the high-temperature crystallization process is needed, the thin first dielectric layer may be partially broken. In this case, in the high-temperature diffusion process, attachment may occur at the broken part of the first dielectric layer and the back surface of the silicon substrate, and then a plurality of inner diffusion regions corresponding to the first doped regions are formed on the surface of the silicon substrate in contact with the first dielectric layer.

Furthermore, the step of preparing the second doped region having a second conductivity type outside or inside the corresponding recess comprises:

introducing a source gas corresponding to the second conductivity type for thermal diffusion outside or inside the corresponding recess to form the second doped region having the second conductivity type; or depositing or spin-coating a doping source corresponding to the second conductivity type for thermal diffusion outside or inside the corresponding recess to form the second doped region having the second conductivity type; or injecting ions corresponding to the second conductivity type for thermal diffusion outside or inside the corresponding recess to form the second doped region having the second conductivity type.

Specifically, when the second doped region is the P-type diffusion layer, the specific preparation process comprises: way I: introducing a source gas containing elements boron, aluminum, gallium or the like (such as a borane gas or a carrier gas carrying boron trichloride or boron tribromide) for thermal diffusion to form the P-type doped layer; way II: depositing a doping source containing boron, aluminum, gallium or the like (such as borosilicate glass) for thermal diffusion to form the P-type doped layer; way III: preparing an aluminum electrode above the doped layer and forming the P-type doped layer doped with aluminum in a high-temperature process; way IV: spin-coating a doping source containing boron, aluminum, gallium or the like (such as boron tribromide) for thermal diffusion to form the P-type doped layer; and way V: injecting ions containing elements boron, aluminum, gallium or the like and performing high-temperature diffusion to form the P-type doped layer.

When the second doped region is the N-type doped layer, the specific preparation process comprises: way I: introducing a source gas containing elements such as nitrogen, phosphorus, arsenic or the like (such as a phosphorane gas or a carrier gas carrying phosphorus oxychloride) for thermal diffusion to form the N-type doped layer; way II: depositing a doping source containing nitrogen, phosphorus, arsenic or the like (such as phosphosilicate glass) for thermal diffusion to form the N-type doped layer; way III: spin-coating a doping source containing nitrogen, phosphorus, arsenic or the like (such as phosphorus oxychloride) for thermal diffusion to form the N-type doped layer; and way IV: injecting ions containing elements such as nitrogen, phosphorus, arsenic or the like and performing high-temperature diffusion to form the N-type doped layer. After a doping source is deposited for thermal diffusion, it is also required to remove the doping source through laser or the like.

At step S31, a second dielectric layer and a third dielectric layer are respectively prepared on the back and front surface of the silicon substrate.

Before step S41, the method may further comprise: texturing the positions between the first conductive regions and the second conductive regions on the back surface of the silicon substrate to obtain the rough texture structure. The specific texturing process may refer to the preceding text.

Specifically, in the process of respectively preparing the second dielectric layer and the third dielectric layer on the back and front surface of the silicon substrate, the preparation is implemented depending on the specific composition types of the second dielectric layer and the third dielectric layer, which is not specifically limited therein. Correspondingly, the second dielectric layer and the third dielectric layer may be one of an aluminum oxide layer, a silicon nitride layer, a silicon oxynitride layer, an intrinsic silicon carbide layer, an intrinsic amorphous silicon layer and a silicon oxide layer, or a combination thereof. In addition, when the second dielectric layer and the third dielectric layer each are set to have a multi-layer structure, the refractive index of each layer is set to successively decrease outward from the silicon substrate, and a magnesium fluoride layer having the lowest requirement for the refractive index may be prepared at the outermost layer.

In addition, before the third dielectric layer is prepared on the front surface of the silicon substrate, an electric field layer or a floating junction may be prepared first, specifically comprising performing phosphorus diffusion on the silicon substrate to obtain the electric field layer or performing boron diffusion to obtain the floating junction. In this case, the electric field layer or the floating junction serves as the FSF of the selective contact region buried solar cell.

At step S51, a conductive layer is prepared on the first conductive regions and the second conductive regions.

Specifically, when the second dielectric layer only covers regions between the first doped regions and the second doped regions in the silicon substrate, the conductive layer covers the entire back of the first doped regions and the second doped regions for electrical connection; when the second dielectric layer extends to cover the first doped regions and the second doped regions, the conductive layer covers the back of the remaining part that does not cover the second dielectric layer in the first doped regions and the second doped regions; and when the second dielectric layer covers the entire back surface of the silicon substrate, the conductive layer passes through the second dielectric layer as well as the first doped regions and the second doped regions through perforation or the like for electrical connection, so that first electrodes are formed on the first doped regions and second electrodes are formed on the second doped regions.

The embodiment of the disclosure has the following beneficial effects with respect to the related art:

1. Recesses are disposed at intervals on a back surface of a silicon substrate, and first conductive regions are disposed inside or outside the recesses and the second conductive regions are disposed outside or inside the recesses in an alternate manner, so that separation between the first conductive regions and the second conductive regions is implemented through some recesses or some protrusions outside the recesses; moreover, the recesses disposed have a lower width control requirement than existing trenches, and preparation of the recesses is easier than preparation of the existing trenches.

2. Since the arrangement of the recesses enables the first dielectric layer to be in contact with both bottom walls and sidewalls of the recesses when the first conductive regions are disposed inside the recesses, current carriers generated on the silicon substrate would also be easily separated through the first dielectric layer on the sidewalls of the recesses and selectively collected into the corresponding first doped regions, so that leakage current can be reduced and selective transport of the current carriers in longitudinal and transverse directions can also be implemented, thereby facilitating multi-dimensional collection of the current carriers on the bottom walls and sidewalls of the recesses.

3. Since the second dielectric layer disposed is at least one in number, passivation is performed on the back surface of the silicon substrate through the second dielectric layer having at least one layer and the first dielectric layer to bring a better passivation effect; and by controlling the refractive index of each layer to successively decrease outward from the silicon substrate, the inner back reflection of light in the long wave band at the silicon substrate can be improved, to increase a short-circuit current density.

4. A recess has a specific depth, and the hard mask is only in direct contact with the protrusion portion between two recesses so that the hard mask will not be in direct contact with the bottom of the recess to reduce impurity contamination, so that the hard mask yields a certain protection effect on the silicon substrate on the bottom wall of the recess, there is no need to worry that the hard mask will cause damage to the silicon substrate, and the damage caused by contact of the hard mask with the surface of the protrusion of the silicon substrate can also be eliminated in the subsequent texturing process.

5. In the process that the hard mask is used to selectively deposit the first doped regions, since the recesses are separated by the silicon substrate protrusion structure having a specific width, when the hard mask is used for covering and performing deposition in a recess region, accurate alignment of the hard mask is not required and a moderate amount of deviation is allowed, so that the alignment of the hard mask gets simpler and then the technological difficulty is reduced.

6. In the related art, due to width and depth limitations to a trench region, a chemical solution cannot completely infiltrate the bottom of the trench for chemical wet texturing due to hydrophobicity of water and a silicon slice. However, in this embodiment, since the recesses are disposed and the back surface of the silicon substrate between adjacent recesses is the boss, it would be easier to obtain the rough texture structure by texturing than existing trench structures; moreover, reflection of light on the inner back surface of the silicon substrate is enhanced after the protrusions on the back surface of the silicon substrate are textured, thereby increasing the light absorption rate of the silicon substrate.

Embodiment 4

The fourth embodiment of the disclosure further provides a cell assembly comprising the selective contact region buried solar cell according to the preceding embodiment.

In the cell assembly in this embodiment, through the selective contact region buried solar cell provided, recesses are disposed at intervals on a back surface of a silicon substrate, and first conductive regions are disposed inside or outside the recesses and the second conductive regions are disposed outside or inside the recesses in an alternate manner, so that separation between the first conductive regions and the second conductive regions is implemented through some recesses or some protrusions outside the recesses; moreover, the recesses disposed have a lower width control requirement than existing trenches, and preparation of the recesses is easier than preparation of the existing trenches. In addition, since the arrangement of the recesses enables the first dielectric layer to be in contact with both bottom walls and sidewalls of the recesses when the first conductive regions are disposed inside the recesses, current carriers generated on the silicon substrate would also be easily separated through the first dielectric layer on the sidewalls of the recesses and selectively collected into the corresponding first doped regions, so that leakage current can be reduced and selective transport of the current carriers in longitudinal and transverse directions can also be implemented, thereby facilitating multi-dimensional collection of the current carriers on the bottom walls and sidewalls of the recesses. Since a second dielectric layer disposed is at least one in number, multi-layer passivation is achieved on the back surface of the silicon substrate through the second dielectric layer having at least one layer, and then a better passivation effect is yielded and inner back reflection is enhanced, thereby yielding a better passivation effect and a better inner back reflection effect and solving the existing problems of a high trench width control requirement and a poor passivation effect.

Embodiment 5

The fifth embodiment of the disclosure further provides a photovoltaic system comprising the cell assembly according to the preceding embodiments.

In the photovoltaic system in this embodiment, through the selective contact region buried solar cell provided in the cell assembly, recesses are disposed at intervals on a back surface of a silicon substrate, and first conductive regions are disposed inside or outside the recesses and the second conductive regions are disposed outside or inside the recesses in an alternate manner, so that separation between the first conductive regions and the second conductive regions is implemented through some recesses or some protrusions outside the recesses; moreover, the recesses disposed have a lower width control requirement than existing trenches, and preparation of the recesses is easier than preparation of the existing trenches. In addition, since the arrangement of the recesses enables the first dielectric layer to be in contact with both bottom walls and sidewalls of the recesses when the first conductive regions are disposed inside the recesses, current carriers generated on the silicon substrate would also be easily separated through the first dielectric layer on the sidewalls of the recesses and selectively collected into the corresponding first doped regions, so that leakage current can be reduced and selective transport of the current carriers in longitudinal and transverse directions can also be implemented, thereby facilitating multi-dimensional collection of the current carriers on the bottom walls and sidewalls of the recesses. Since a second dielectric layer disposed is at least one in number, multi-layer passivation is achieved on the back surface of the silicon substrate through the second dielectric layer having at least one layer, and then a better passivation effect is yielded and inner back reflection is enhanced, thereby yielding a better passivation effect and a better inner back reflection effect and solving the existing problems of a high trench width control requirement and a poor passivation effect.

It will be obvious to those skilled in the art that changes and modifications may be made, and therefore, the aim in the appended claims is to cover all such changes and modifications.

What is claimed is:

1. A back contact structure of a solar cell, the back contact structure comprising:
   a silicon substrate, the silicon substrate comprising a back surface comprising a plurality of recesses disposed at intervals and a plurality of interval portions between every two of the plurality of recesses;
   a plurality of first conductive regions and a plurality of second conductive regions disposed alternately on the back surface of the silicon substrate, wherein one of the plurality of first conductive regions and the plurality of second conductive regions is disposed inside the plurality of recesses, respectively, and the other one is disposed outside the plurality of recesses; each of the plurality of first conductive regions comprises a first dielectric layer disposed on the silicon substrate and a first doped region disposed on the first dielectric layer, resulting in a plurality of first dielectric layers and a plurality of first doped regions; and each of the plurality of second conductive regions consists of a second doped region on the silicon substrate, resulting in a plurality of second doped regions;
   a second dielectric layer disposed between each of the plurality of first conductive regions and an adjacent one of the plurality of second conductive regions and disposed on the plurality of first conductive regions and the plurality of second conductive regions, the second dielectric layer comprising at least two layers; and
   a conductive layer directly disposed on each of the plurality of first doped regions and on each of the plurality of second doped regions, the conductive layer comprising a transparent conductive oxide (TCO) and/or a metal electrode;
   wherein:
   the first dielectric layer and the second dielectric layer are distinct;
   each of the plurality of first conductive regions defines a rectangular, arc-shaped or trapezoid cross-section within each of the plurality of recesses;
   each of the plurality of interval portions comprises two side portions and a middle portion, the two side portions are respectively adjacent to two of the plurality of recesses adjacent to the each of the plurality of interval portions, and the middle portion is disposed between the two side portions;
   when the plurality of first conductive regions is respectively disposed inside the plurality of recesses and the plurality of second conductive regions is respectively disposed on the plurality of interval portions, a depth of the plurality of recesses is greater than a thickness of the plurality of first conductive regions, thereby the plurality of first conductive regions is entirely enclosed inside the plurality of recesses, respectively, and each of the plurality of the second doped regions is disposed only within a top portion of the middle portion of each of the plurality of interval portions, thereby the plurality of second conductive regions is spatially separated from the plurality of first conductive regions entirely enclosed inside the plurality of recesses; the second dielectric layer is disposed on and in direct contact with the two side portions; and the second dielectric layer covers at least a portion of a side wall of the plurality of recesses; or
   when the plurality of second conductive regions is respectively disposed inside the plurality of recesses and each of the plurality of first conductive regions is directly disposed on the top portion of the middle portion of each of the plurality of interval portions, each of the plurality of second doped regions is a doped portion in the silicon substrate on a bottom of each of the plurality of recesses, thereby the plurality of second conductive regions is spatially separated from the plurality of first conductive regions directly disposed on the top portion of the middle portion; the second dielectric layer is disposed on and in direct contact with the two side portions; and the second dielectric layer covers at least the portion of the side wall of the plurality of recesses.

2. The structure of claim 1, wherein:
   each of the plurality of first doped regions is a P-type doped region, and each of the plurality of second doped regions is an N-type doped layer; or
   each of the plurality of first doped regions is an N-type doped region, and each of the plurality of second doped regions is a P-type doped layer.

3. The structure of claim 1, wherein each of the plurality of first doped regions comprises doped polycrystalline silicon, doped silicon carbide or doped amorphous silicon.

4. The structure of claim 1, wherein each of the plurality of first dielectric layers is a tunneling oxide layer, an intrinsic silicon carbide layer, an intrinsic amorphous silicon layer, or a combination thereof.

5. The structure of claim 1, wherein the second dielectric layer is an aluminum oxide layer, a silicon nitride layer, a silicon oxynitride layer, an intrinsic silicon carbide layer, an intrinsic amorphous silicon layer, a silicon oxide layer, or a combination thereof.

6. The structure of claim 1, wherein a part of the back surface of the silicon substrate between the plurality of first conductive regions and the plurality of second conductive regions comprises a rough texture structure.

7. The structure of claim 2, wherein a width of the P-type doped region is 300-600 μm, and a width of the N-type doped region is 100-500 μm.

8. The structure of claim 1, wherein a depth of each of the plurality of recesses is 0.01-10 μm, and a horizontal distance between the plurality of first conductive regions and the plurality of second conductive regions is 0-500 μm.

9. The structure of claim 1, wherein the plurality of recesses is in the shape of an arc, a trapezoid, or a square.

10. The structure of claim 1, wherein each of the plurality of second doped regions has a junction depth of 0.01-1 μm, a sheet resistance of 10-500 ohm/sqr.

11. The structure of claim 1, wherein a thickness of each of the plurality of first dielectric layers is 1-20 nm, and a total thickness of the plurality of first conductive regions is greater than 20 nm.

12. The structure of claim 4, wherein each of the plurality of first dielectric layers comprises the tunneling oxide layer and the intrinsic silicon carbide layer.

13. The structure of claim 4, wherein the tunneling oxide layer comprises one or more of a silicon oxide layer and an aluminum oxide layer.

14. The structure of claim 5, wherein the second dielectric layer comprises the aluminum oxide layer and the intrinsic silicon carbide layer, or the second dielectric layer comprises the silicon oxide layer and the intrinsic silicon carbide layer, and a thickness of the second dielectric layer is greater than 25 nm.

15. The structure of claim 14, wherein a thickness of the aluminum oxide layer or the silicon oxide layer in the second dielectric layer is less than 25 nm, and a thickness of the intrinsic silicon carbide layer in the second dielectric layer is greater than 10 nm.

16. The structure of claim 5, wherein a magnesium fluoride layer is disposed at an outer layer of the second dielectric layer.

17. The structure of claim 1, wherein the metal electrode comprises a silver electrode, a copper electrode, an aluminum electrode, a tin-clad copper electrode, or a silver-clad copper electrode.

18. The structure of claim 17, wherein the copper electrode is an electro-plated copper prepared through an electroplating process or a copper electrode prepared through physical vapor deposition.

19. A selective contact region buried solar cell, comprising:
    the back contact structure of claim 1; and
    a third dielectric layer disposed on a front surface of the silicon substrate.

20. The cell of claim 19, wherein the third dielectric layer is an aluminum oxide layer, a silicon nitride layer, a silicon oxynitride layer, a silicon carbide layer, an intrinsic amorphous silicon layer, a silicon oxide layer, or a combination thereof.

21. The cell of claim 20, wherein the third dielectric layer comprises the silicon oxide layer and the silicon carbide layer, or the third dielectric layer comprises the aluminum oxide layer and the silicon carbide layer, and a thickness of the third dielectric layer is greater than 50 nm.

22. The cell of claim 21, wherein a thickness of the aluminum oxide layer or the silicon oxide layer in the third dielectric layer is less than 40 nm, and a thickness of the silicon carbide layer in the third dielectric layer is greater than 10 nm.

23. The cell of claim 20, wherein the silicon carbide layer in the third dielectric layer comprises at least one silicon carbide film; and refractive indexes of different silicon carbide films decrease from the front surface of the silicon substrate to outside.

24. The cell of claim 20, wherein a magnesium fluoride layer is disposed at an outer layer of the third dielectric layer.

25. The cell of claim 19, wherein an electric field layer or a floating junction is disposed between the front surface of the silicon substrate and the third dielectric layer.

26. A cell assembly, comprising the cell of claim 19.

27. A photovoltaic system, comprising the cell assembly of claim 26.

28. A back contact structure of a solar cell, the back contact structure comprising:
    a silicon substrate, the silicon substrate comprising a back surface comprising a plurality of recesses disposed at intervals and a plurality of interval portions between every two of the plurality of recesses;
    a plurality of first conductive regions and a plurality of second conductive regions disposed alternately on the back surface of the silicon substrate, wherein one of the plurality of first conductive regions and the plurality of second conductive regions is disposed inside the plurality of recesses, respectively, and the other one is disposed outside the plurality of recesses; each of the plurality of first conductive regions comprises a first dielectric layer disposed on the silicon substrate and a first doped region disposed on the first dielectric layer, resulting in a plurality of first dielectric layers and a plurality of first doped regions; and each of the plurality of second conductive regions consists of a second doped region on the silicon substrate, resulting in a plurality of second doped regions;
    a second dielectric layer disposed between each of the plurality of first conductive regions and an adjacent one of the plurality of second conductive regions and disposed on the plurality of first conductive regions and the plurality of second conductive regions, the second dielectric layer comprising at least two layers; and
    a conductive layer directly disposed on each of the plurality of first doped regions and on each of the plurality of second doped regions, the conductive layer comprising a transparent conductive oxide (TCO) and/or a metal electrode;
wherein:
    the first dielectric layer and the second dielectric layer are distinct;
    each of the plurality of first conductive regions defines a rectangular, arc-shaped or trapezoid cross-section within each of the plurality of recesses;
    each of the plurality of interval portions comprises two side portions and a middle portion, the two side portions are respectively adjacent to two of the plurality of recesses adjacent to the each of the plurality of interval portions, and the middle portion is disposed between the two side portions; and
    the plurality of second conductive regions is respectively disposed inside the plurality of recesses and each of the plurality of first conductive regions is directly disposed on a top portion of the middle portion of each of the plurality of interval portions, each of the plurality of second doped regions is a doped portion in the silicon substrate on a bottom of each of the plurality of recesses, thereby the plurality of second conductive regions is spatially separated from the plurality of first conductive regions directly disposed on the top portion of the middle portion; the second dielectric layer is disposed on and in direct contact with the two side portions; and the second dielectric layer covers at least the portion of the side wall of the plurality of recesses.

* * * * *